(12) United States Patent
Guo et al.

(10) Patent No.: US 11,942,157 B2
(45) Date of Patent: Mar. 26, 2024

(54) VARIABLE BIT LINE BIAS FOR NONVOLATILE MEMORY

(71) Applicant: SanDisk Technologies LLC, Addison, TX (US)

(72) Inventors: Jiacen Guo, Sunnyvale, CA (US); Xiang Yang, Santa Clara, CA (US); Xiaochen Zhu, Milpitas, CA (US)

(73) Assignee: SanDisk Technologies LLC, Austin, TX (US)

(*) Notice: Subject to any disclaimer, the term of this patent is extended or adjusted under 35 U.S.C. 154(b) by 155 days.

(21) Appl. No.: 17/697,252

(22) Filed: Mar. 17, 2022

(65) Prior Publication Data

US 2023/0298667 A1    Sep. 21, 2023

(51) Int. Cl.
| | |
|---|---|
| *G11C 16/10* | (2006.01) |
| *G11C 16/08* | (2006.01) |
| *G11C 16/24* | (2006.01) |
| G11C 16/04 | (2006.01) |
| H10B 43/27 | (2023.01) |

(52) U.S. Cl.
CPC ............... *G11C 16/10* (2013.01); *G11C 16/08* (2013.01); *G11C 16/24* (2013.01); *G11C 16/0483* (2013.01); *H10B 43/27* (2023.02)

(58) Field of Classification Search
CPC ......... G11C 16/10; G11C 16/08; G11C 16/24; G11C 16/4083; H10B 43/27
USPC ..................................................... 365/185.19
See application file for complete search history.

(56) References Cited

U.S. PATENT DOCUMENTS

| | | | |
|---|---|---|---|
| 2010/0020618 A1* | 1/2010 | Kim ....................... | G11C 16/24 365/185.23 |
| 2011/0122692 A1* | 5/2011 | Dutta ................... | G11C 11/5628 365/185.03 |

* cited by examiner

*Primary Examiner* — Huan Hoang
(74) *Attorney, Agent, or Firm* — Vierra Magen Marcus LLP

(57) ABSTRACT

An apparatus is provided that includes a word line coupled to a word line driver circuit, bit lines, a plurality of nonvolatile memory cells each coupled to the word line and a corresponding one of the bit lines, and a control circuit coupled to the word line and the bit lines. The control circuit is configured to program the memory cells by causing the word line driver to apply a program pulse to the word line, and biasing each bit line to a corresponding bit line voltage that has a value that varies based on a distance between the word line driver and the corresponding bit line.

20 Claims, 18 Drawing Sheets

|  | S0 | S1 | S2 | S3 | S4 | S5 | S6 | S7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |

VARIABLE BIT LINE BIAS FOR NONVOLATILE MEMORY

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory).

Memory systems can be used to store data provided by a host device (or other client). However, various challenges are presented in operating such memory systems. In particular, as memory cells decrease in size and memory arrays increase in density, maintaining the integrity of data being stored becomes more challenging.

BRIEF DESCRIPTION OF THE DRAWINGS

Like-numbered elements refer to common components in the different figures.

DETAILED DESCRIPTION

Technology is described for use during programming non-volatile memory cells. In particular, the described technology compensates for the variation of word line voltage that results from increased resistive-capacitive loading along the word line with increasing distance from a word line driver. In the disclosed technology bit lines coupled to memory cells that are to be programmed are not all biased to the same voltage. Instead, in embodiments each bit line coupled to a memory cell that is to be programmed is biased to a bit line voltage that varies based on distance from the word line driver.

Some non-volatile memory devices are used to store two ranges of charges and, therefore, the memory cells can be programmed/erased between two data states: an erased state and a programmed state (corresponding to data "1" and data "0"). Such a device is referred to as a binary device or a single-level cell (SLC). In contrast, a multi-state flash memory cell (storing multi-state data) is implemented by identifying multiple, distinct allowed threshold voltage ranges. Such a device is referred to as a multi-level cell (MLC).

Each distinct threshold voltage range corresponds to a predetermined value for the set of data bits. For example, some memory cells can store two or more bits. The specific relationship between the data programmed into the memory cell and the threshold voltage ranges of the memory cell depends upon the data encoding scheme adopted for the memory cells.

In addition to the gains in capacity resulting from multi-state memory architectures, significant advantages in memory technology have resulted from steadily scaling down the physical dimensions of memory cells. Smaller memory cells can be packed more densely on a given die area, allowing higher memory capacity for the same price as an older memory technology.

Figure 1:
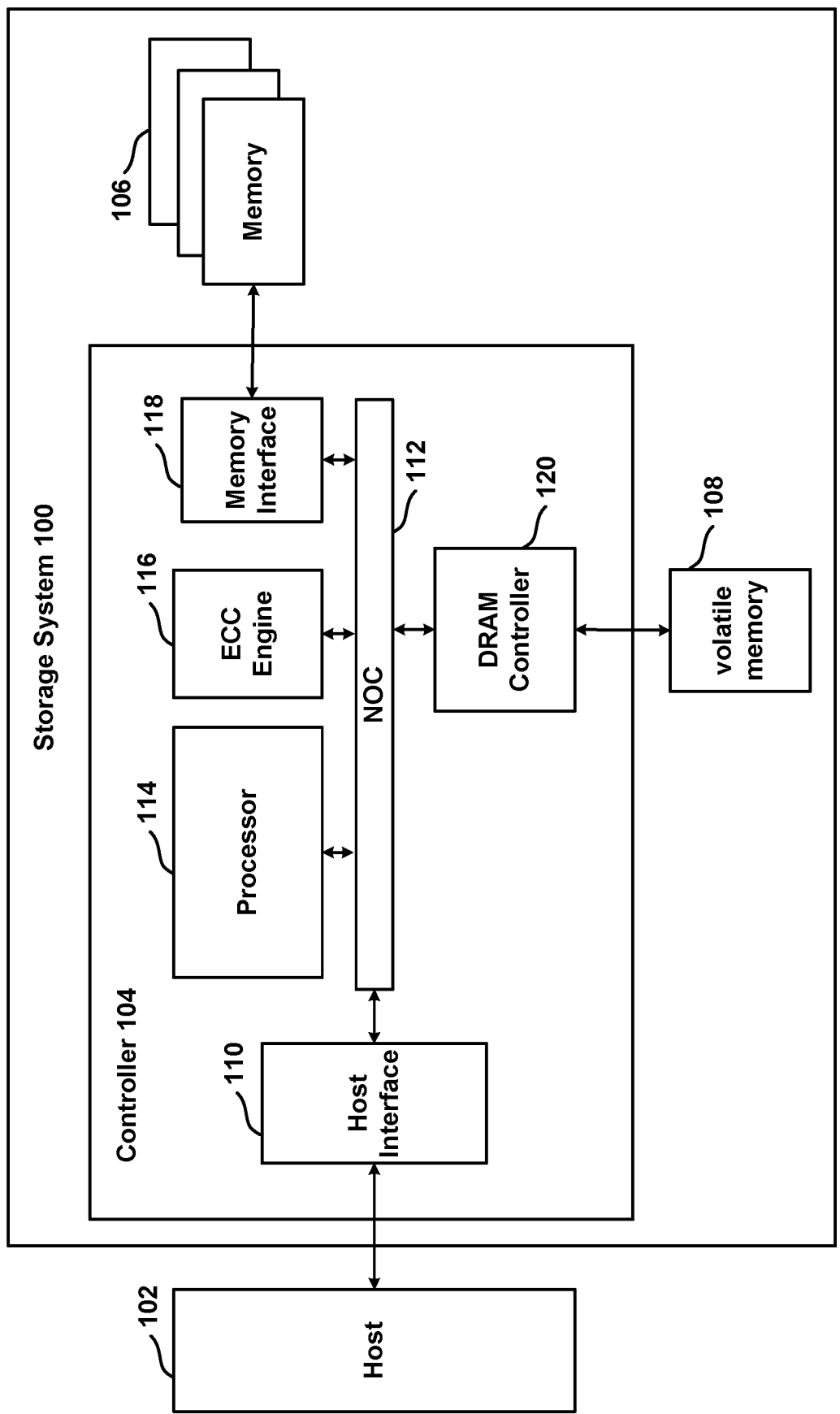
FIG. 1 is a block diagram depicting one embodiment of a memory system.

FIG. 1 is a block diagram of an embodiment of a memory system 100 that implements the described technology. In an embodiment, memory system 100 is a solid state drive ("SSD"). Memory system 100 also can be a memory card, USB drive or other type of storage system. The proposed technology is not limited to any one type of memory system. Memory system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, memory system 100. In other embodiments, memory system 100 is embedded within host 102.

The components of memory system 100 depicted in FIG. 1 are electrical circuits. Memory system 100 includes a controller 104 connected to one or more memory die 106 and local high speed volatile memory 108 (e.g., DRAM). The one or more memory die 106 each include a plurality of non-volatile memory cells. More information about the structure of each memory die 106 is provided below. Local high speed volatile memory 108 is used by controller 104 to perform certain functions. For example, local high speed volatile memory 108 stores logical to physical address translation tables ("L2P tables")

Controller 104 includes a host interface 110 that is connected to and in communication with host 102. In one embodiment, host interface 110 provides a PCIe interface. Other interfaces can also be used, such as SCSI, SATA, etc. Host interface 110 is also connected to a network-on-chip (NOC) 112, which is a communication subsystem on an integrated circuit. In other embodiments, NOC 112 can be replaced by a bus.

A NOC can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. In embodiments, the wires and the links of a NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges).

Connected to and in communication with NOC 112 is processor 114, ECC engine 116, memory interface 118, and DRAM controller 120. DRAM controller 120 is used to operate and communicate with local high speed volatile memory 108 (e.g., DRAM). In other embodiments, local high speed volatile memory 108 can be SRAM or another type of volatile memory.

ECC engine 116 performs error correction services. For example, ECC engine 116 performs data encoding and decoding, as per the implemented ECC technique. In one embodiment, ECC engine 116 is an electrical circuit programmed by software. For example, ECC engine 116 can be a processor that can be programmed. In other embodiments, ECC engine 116 is a custom and dedicated hardware circuit without any software. In another embodiment, the function of ECC engine 116 is implemented by processor 114.

Processor 114 performs the various controller memory operations, such as programming, erasing, reading, as well as memory management processes. In an embodiment, processor 114 is programmed by firmware. In other embodiments, processor 114 is a custom and dedicated hardware circuit without any software. In an embodiment, processor 114 also implements a translation module, as a software/firmware process or as a dedicated hardware circuit.

In many systems, non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To enable this system, the controller (e.g., the translation module) performs address translation between the logical addresses used by the host and the physical addresses used by the memory dies.

One example implementation is to maintain tables (e.g., the L2P tables mentioned above) that identify a translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure.

In some examples, the memory space of a storage system is so large that local memory 108 cannot hold all of the L2P tables. In such a case, the entire set of L2P tables are stored in a memory die 106 and a subset of the L2P tables are cached (L2P cache) in the local high speed volatile memory 108.

In an embodiment, memory interface 118 communicates with one or more memory die 106. In an embodiment, memory interface 118 provides a Toggle Mode interface. Other interfaces also can be used. In some example implementations, memory interface 118 (or another portion of controller 104) implements a scheduler and buffer for transmitting data to and receiving data from one or more memory die.

Figure 2:
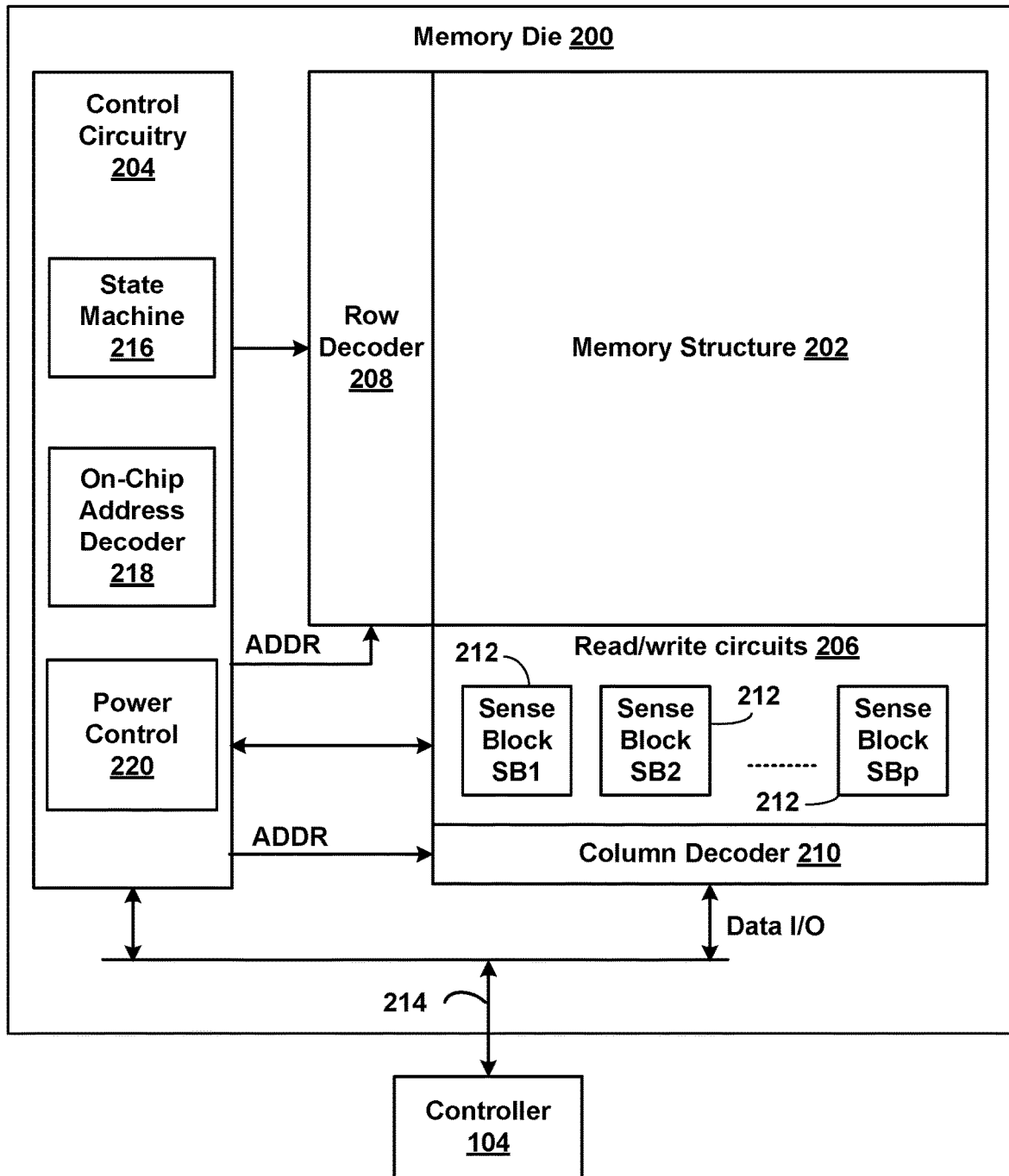
FIG. 2 is a block diagram of one embodiment of a memory die.

FIG. 2 is a functional block diagram of one embodiment of a memory die 200. Each of the one or more memory die 106 of FIG. 1 can be implemented as memory die 200 of FIG. 2. The components depicted in FIG. 2 are electrical circuits. In an embodiment, each memory die 200 includes a memory structure 202, control circuitry 204, and read/write circuits 206. Memory structure 202 is addressable by word lines via a row decoder 208 and by bit lines via a column decoder 210.

In an embodiment, read/write circuits 206 include multiple sense blocks 212 including SB1, SB2, . . . , SBp (sensing circuitry) and allow a page (or multiple pages) of data in multiple memory cells to be read or programmed (written) in parallel. In an embodiment, each sense block 212 include a sense amplifier and a set of latches connected to the bit line. The latches store data to be written and/or data that has been read. In an embodiment, the sense amplifier in each sense block 212 includes bit line drivers. In an embodiment, commands and data are transferred between controller 104 and memory die 200 via lines 214. In an embodiment, memory die 200 includes a set of input and/or output (I/O) pins that connect to lines 214.

In an embodiment, control circuitry 204 cooperates with read/write circuits 206 to perform memory operations (e.g., write, read, erase, and others) on memory structure 202. In an embodiment, control circuitry 204 includes a state machine 216, an on-chip address decoder 218, and a power control circuit 220. In an embodiment, state machine 216 provides die-level control of memory operations. In an embodiment, state machine 216 is programmable by software. In other embodiments, state machine 216 does not use software and is completely implemented in hardware (e.g., electrical circuits). In some embodiments, state machine 216 can be replaced by a microcontroller or microprocessor. In an embodiment, control circuitry 204 includes buffers such as registers, ROM fuses and other storage devices for storing default values such as base voltages and other parameters.

On-chip address decoder 218 provides an address interface between addresses used by controller 104 to the hardware address used by row decoder 208 and column decoder 210. Power control module 220 controls the power and voltages supplied to the word lines and bit lines during memory operations. Power control module 220 may include charge pumps for creating voltages.

For purposes of this document, control circuitry 204, read/write circuits 206, row decoder 208 and column decoder 210 comprise a control circuit for memory structure 202. In other embodiments, other circuits that support and operate on memory structure 202 can be referred to as a control circuit. For example, in some embodiments, controller 104 can operate as the control circuit or can be part of the control circuit. The control circuit also can be implemented as a microprocessor or other type of processor that is hardwired or programmed to perform the functions described herein.

For purposes of this document, control circuitry 204, read/write circuits 206, row decoder 208 and column decoder 210 comprise peripheral circuits for memory structure 202, as they are not part of memory structure 202 but are on the same die as memory structure 202 and are used to operate memory structure 202.

In an embodiment, memory structure 202 is a three dimensional memory array of non-volatile memory cells. In an embodiment, memory structure 202 is a monolithic three dimensional memory array in which multiple memory levels are formed above a single substrate, such as a wafer. The memory structure may be any type of non-volatile memory that is formed in one or more physical levels of arrays of memory cells having an active area disposed above a silicon (or other type of) substrate. In one example, the non-volatile memory cells of memory structure 202 include vertical NAND strings with charge-trapping material such as described. A NAND string includes memory cells connected by a channel.

In another embodiment, memory structure 202 includes a two dimensional memory array of non-volatile memory cells. In an example, the non-volatile memory cells are NAND flash memory cells utilizing floating gates. Other types of memory cells (e.g., NOR-type flash memory) also can be used.

The exact type of memory array architecture or memory cell included in memory structure 202 is not limited to the examples above. Many different types of memory array architectures or memory cell technologies can be used to form memory structure 202. No particular non-volatile memory technology is required for purposes of the new technology described herein.

Other examples of suitable technologies for memory cells of the memory structure 202 include ReRAM memories, magnetoresistive memory (MRAM), phase change memory (PCM), and the like. Examples of suitable technologies for architectures of memory structure 202 include two dimensional arrays, three dimensional arrays, cross-point arrays, stacked two dimensional arrays, vertical bit line arrays, and the like.

One example of a cross point memory includes reversible resistance-switching elements arranged in cross point arrays accessed by X lines and Y lines (e.g., word lines and bit lines). In another embodiment, the memory cells may include conductive bridge memory elements. A conductive bridge memory element also may be referred to as a programmable metallization cell.

A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of solid electrolyte between the two electrodes.

MRAM stores data using magnetic storage elements. The magnetic storage elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—$Sb_2Te_3$ super lattice to achieve non-thermal phase changes by simply changing the coordination state of Germanium atoms with a laser pulse (or light pulse from another source). Therefore, the doses of programming are laser pulses. The memory cells can be inhibited from programming by blocking the memory cells from receiving the light.

A person of ordinary skill in the art will recognize that the technology described herein is not limited to a single specific memory structure, but covers many relevant memory structures within the scope of the technology as described herein and as understood by one of ordinary skill in the art.

Figure 3:
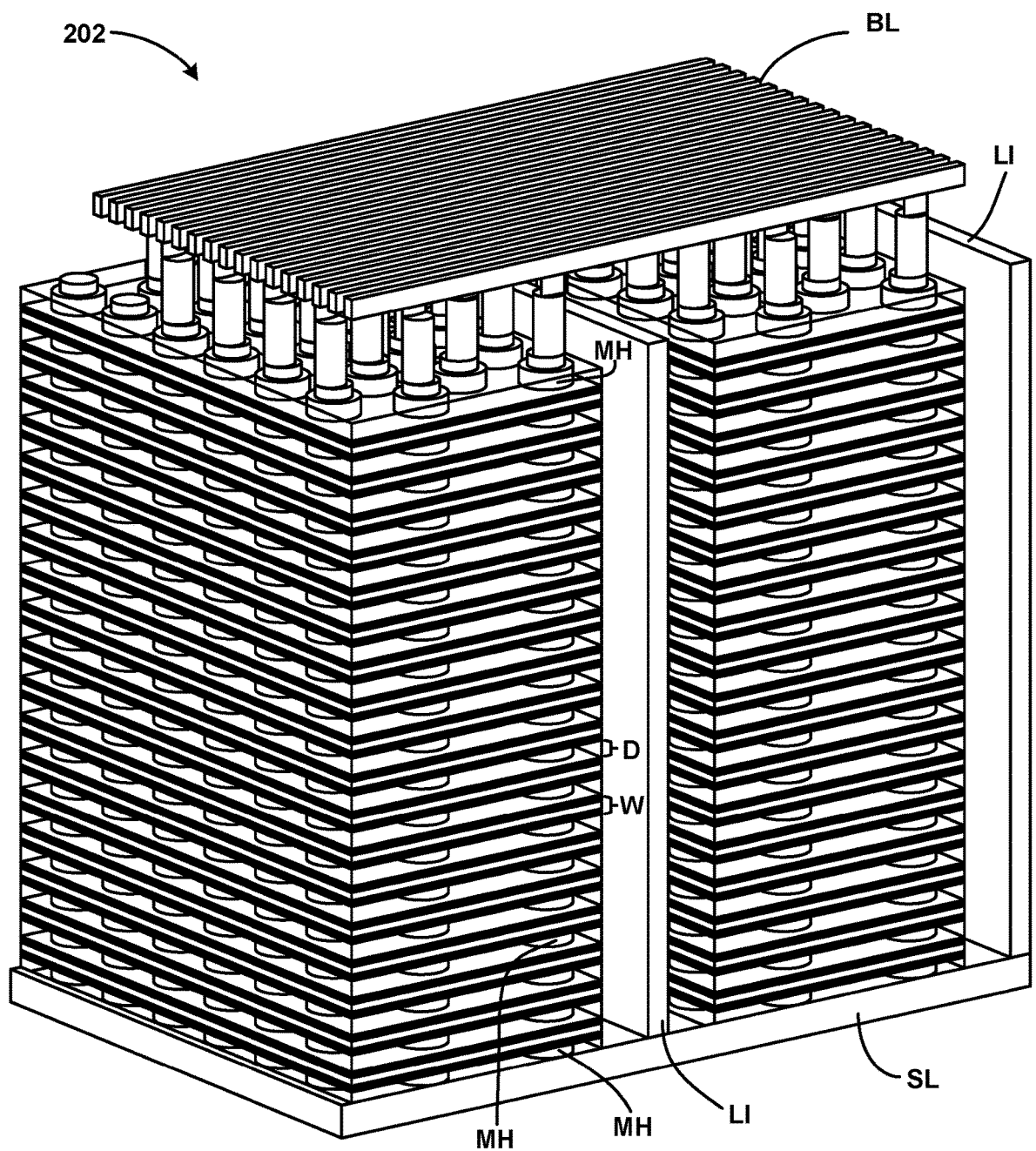
FIG. 3 is a perspective view of a portion of one embodiment of a three dimensional memory structure.

FIG. 3 is a perspective view of a portion of an embodiment of a three dimensional memory array that includes memory structure 202. In an embodiment, memory structure 202 includes multiple non-volatile memory cells. For example, FIG. 3 shows a portion of one block of memory cells. The structure depicted includes a set of bit lines BL positioned above a stack of alternating dielectric layers and conductive layers. For example purposes, one of the dielectric layers is marked as D and one of the conductive layers (also called word line layers) is marked as W.

The number of alternating dielectric layers and conductive layers can vary based on specific implementation requirements. One set of embodiments includes between 108-300 alternating dielectric layers and conductive layers. One example embodiment includes 96 data word line layers, 8 select layers, 6 dummy word line layers and 110 Dielectric layers. More or less than 108-300 layers also can be used. In an embodiment, the alternating dielectric layers and conductive layers are divided into four regions by local interconnects LI. FIG. 3 shows two regions and two local interconnects LI.

A source line layer SL is below the alternating dielectric layers and word line layers. Memory holes are formed in the stack of alternating dielectric layers and conductive layers. For example, one of the memory holes is marked as MH. Note that in FIG. 3 the dielectric layers are depicted as see-through so that the reader can see the memory holes positioned in the stack of alternating dielectric layers and conductive layers.

In an embodiment, NAND strings are formed by filling the memory hole with materials including a charge-trapping material to create a vertical column of memory cells (also referred to as a memory column). In an embodiment, each memory cell can store one or more bits of data. In an embodiment, each memory hole MH is associated with and coupled to a corresponding one of bit lines BL. In an embodiment, each bit line BL is coupled to one or more memory holes MH. More details of a three dimensional memory array that comprises memory structure 202 is provided below with respect to FIG. 4A-4F.

Figure 4A:
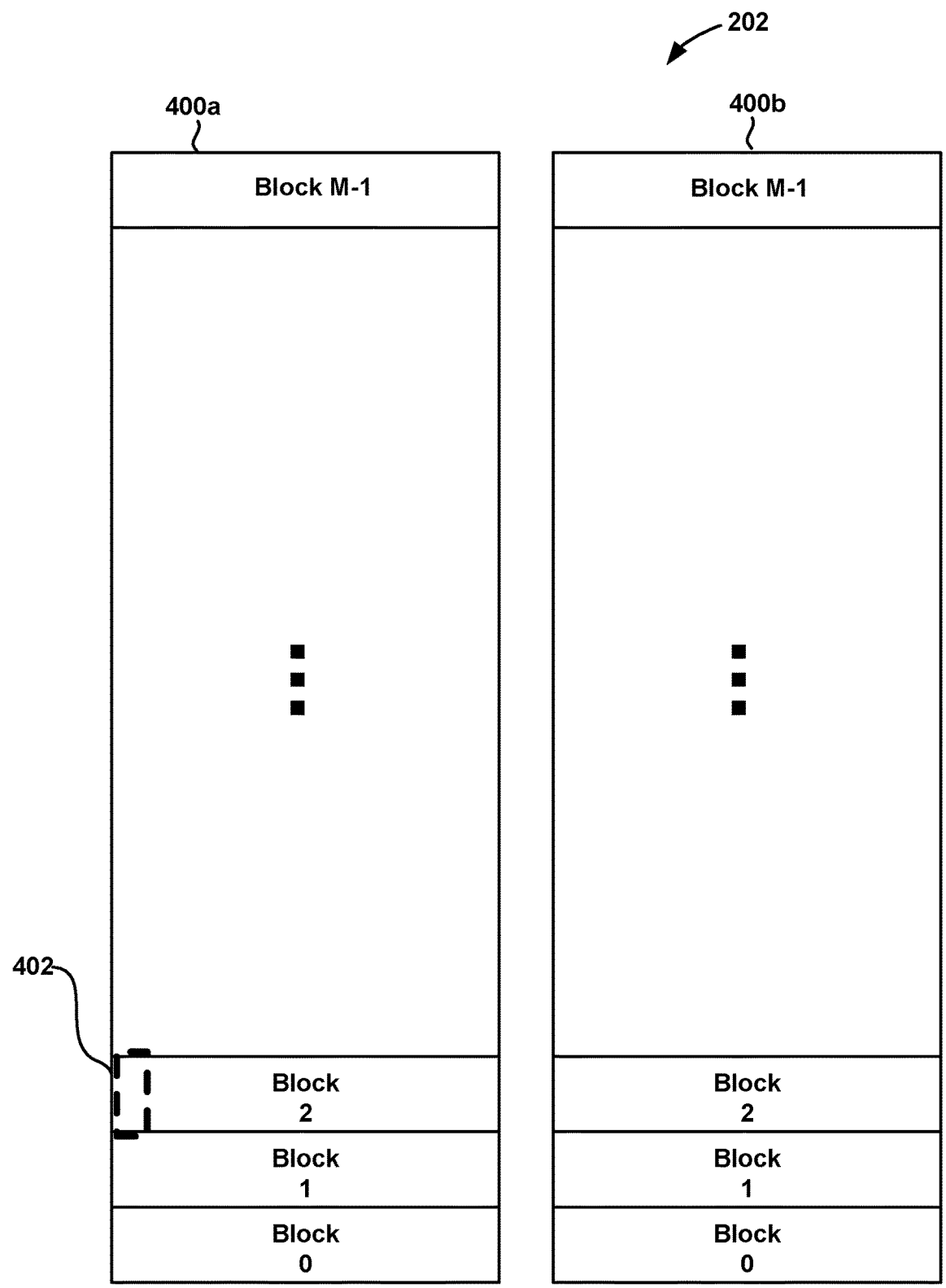
FIG. 4A is a block diagram of a memory structure having two planes.

FIG. 4A is a block diagram explaining one example organization of memory structure 202, which is divided into two planes 400a and 400b. Both planes are on the same memory die 200 (FIG. 2). Each plane is then divided into M blocks. In one example, each plane has about 2000 blocks. However, different numbers of blocks and planes also can be used. A portion 402 of block 2 of memory plane 400a is shown in dashed line in FIG. 4A.

In an embodiment, a block of memory cells is a unit of erase. That is, all memory cells of a block are erased together. In other embodiments, memory cells can be grouped into blocks for other reasons, such as to organize memory structure 202 to enable the signaling and selection circuits. In some embodiments, a block represents a group of connected memory cells as the memory cells of a block share a common set of word lines. Although FIG. 4A shows two planes on the same die, in other embodiments more than two planes can be implemented. For example, memory structure 202 can include 2-8 (or more) planes.

Figure 4B:
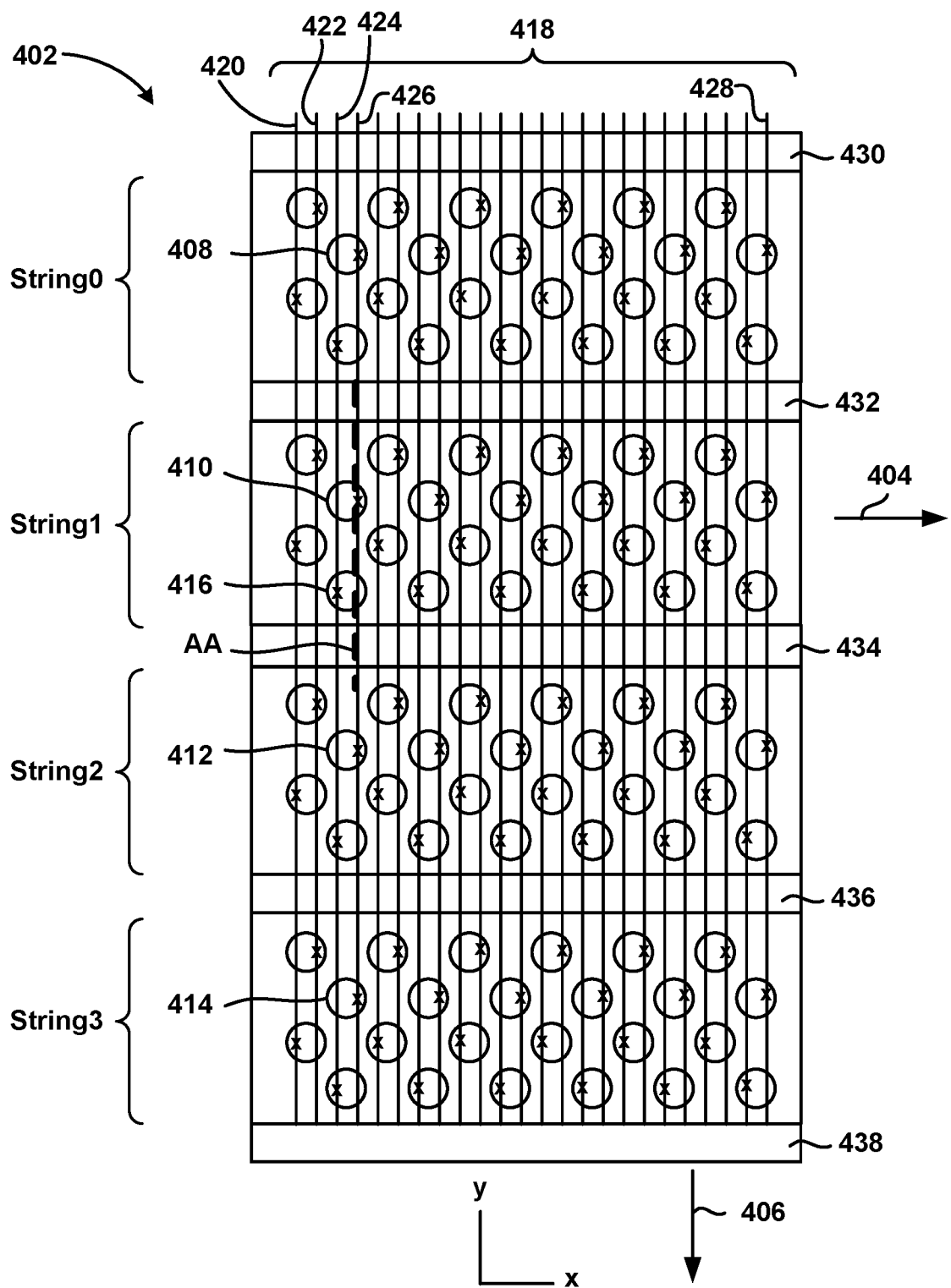
FIG. 4B depicts a top view of a portion of a block of memory cells.

FIGS. 4B-4F depict an example three dimensional ("3D") NAND structure that corresponds to the structure of FIG. 3. FIG. 4B is a block diagram depicting a top view of portion 402 of block 2 (FIG. 4A) of memory structure 202. As can be seen from FIG. 4B, portion 402 extends in direction 404 and direction 406. In an embodiment, the memory array has many layers, however, FIG. 4B only shows the top layer. To avoid overcrowding the drawing, individual word lines are not depicted in FIG. 4B.

FIG. 4B depicts a plurality of circles that represent memory holes, which are also referred to as memory columns. For example, FIG. 4B depicts memory holes 408, 410, 412, 414 and 416. Each memory hole includes multiple select transistors (also referred to as a select gate or selection gate) and multiple memory cells. In an embodiment, each memory hole implements a NAND string. Because portion 402 extends in directions 404 and 406, the block includes more memory holes than depicted in FIG. 4B.

FIG. 4B also depicts a set of bit lines 418, including bit lines 420, 422, 424, 426, . . . 428. In an embodiment, each memory hole is associated with and coupled to a corresponding one of the bit lines. In an embodiment, each bit line is coupled to one or more memory holes. FIG. 4B shows twenty four bit lines because only a portion of the block is depicted. It is contemplated that more than twenty four bit lines are connected to memory holes of the block. Each of the circles representing a memory hole has an "x" to indicate a connection to one bit line. For example, bit line 426 is connected to memory holes 408, 410, 412 and 414.

Portion 402 depicted in FIG. 4B includes a set of local interconnects 430, 432, 434, 436 and 438 that connect the various layers to a source line below the memory holes. Local interconnects 430, 432, 434, 436 and 438 also serve to divide each layer of the block into four regions. For example, the top layer depicted in FIG. 4B is divided into four regions designated as String0, String1, String2 and String3. In the layers of the block that implement memory cells, String0, String1, String2 and String3 also may be referred to as word line fingers that are separated by the local interconnects.

In an embodiment, word line fingers on a common level of a block connect together to form a single word line. In another embodiment, the word line fingers on the same level are not connected together. In an example implementation, a bit line connects to a single memory hole in each of String0, String1, String2 and String3. In that implementation, each block has sixteen rows of active columns and each bit line connects to four rows in each block.

In an embodiment, all four rows connected to a common bit line are connected to the same word line (via different word line fingers on the same level that are connected together). Therefore, the system uses the source side selection lines and the drain side selection lines to choose one (or another subset) of the four to be subjected to a memory operation (program, verify, read, and/or erase).

Although FIG. 4B shows four regions String0, String1, String2 and String3, each having four rows of memory holes, and sixteen rows of memory holes in a block, those exact numbers are an example implementation. Other embodiments may include more or less regions per block, more or less rows of memory holes per region and more or less rows of memory holes per block. FIG. 4B also shows the memory holes being staggered. In other embodiments, different patterns of staggering can be used. In some embodiments, the memory holes are not staggered.

Figure 4C:
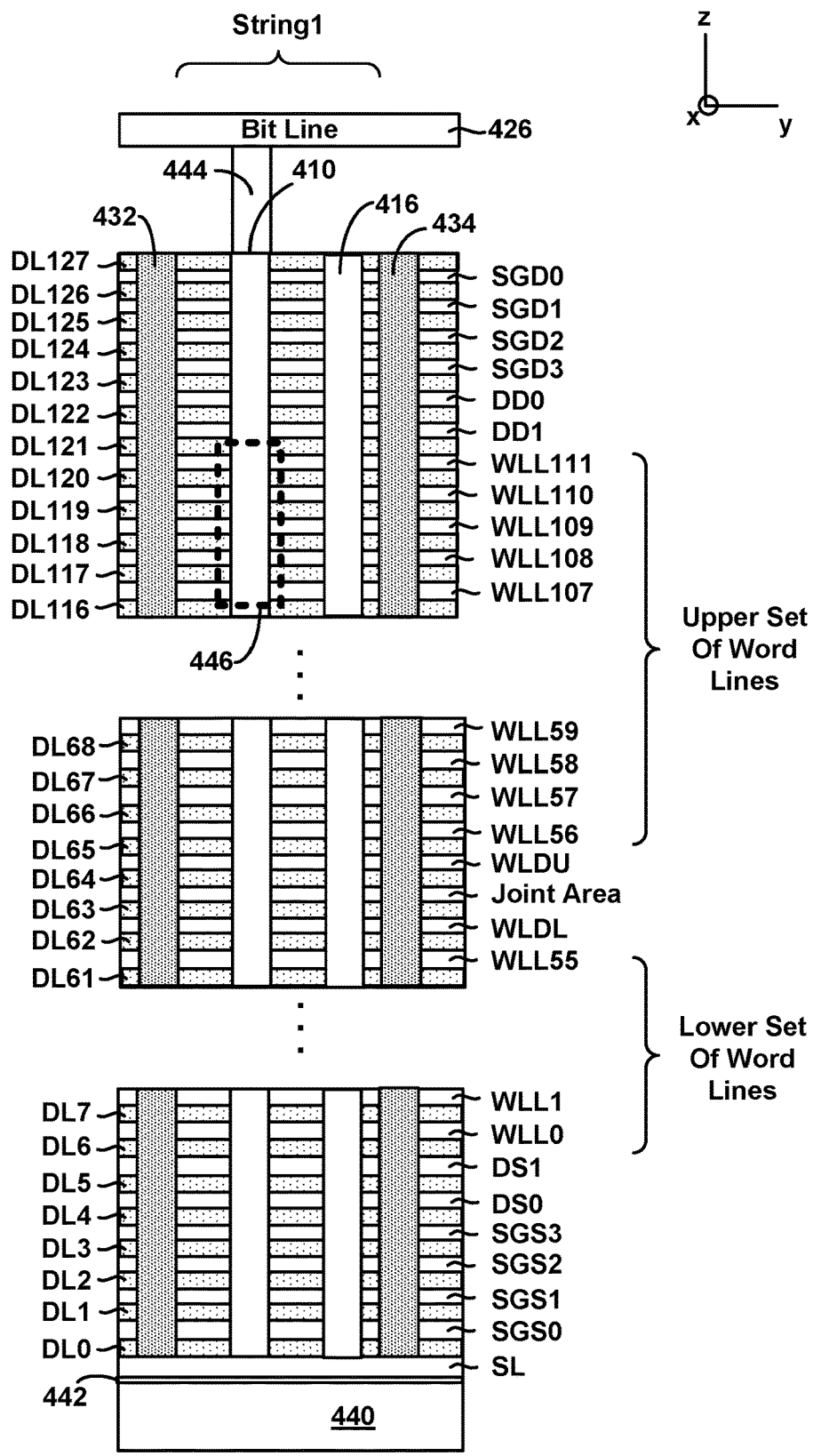
FIG. 4C depicts a cross sectional view of a portion of a block of memory cells.

FIG. 4C depicts a portion of one embodiment of a three dimensional memory structure 202 showing a cross-sectional view along line AA of FIG. 4B. This cross sectional view cuts through memory holes 410 and 416 of String1 (see FIG. 4B). The structure of FIG. 4C includes four drain side select layers SGD0, SGD1, SGD2 and SGD3, four source side select layers SGS0, SGS1, SGS2 and SGS3, six dummy word line layers DD0, DD1, DS0, DS1, WLDL, WLDU, and one hundred and twelve data word line layers WLL0-WLL111 for connecting to memory cells. Other embodiments can implement more or less than four drain side select layers, more or less than four source side select layers, more or less than six dummy word line layers, and more or less than one hundred and twelve word lines.

Memory holes 410 and 416 are depicted protruding through the drain side select layers, source side select layers, dummy word line layers and word line layers. In one embodiment, each memory hole includes a vertical NAND string. Below the memory holes and the layers listed below is substrate 440, an insulating film 442 on the substrate, and source line SL. The NAND string of memory hole 410 has a source end at a bottom of the stack and a drain end at a top of the stack. As in FIG. 4B, FIG. 4C shows memory hole 410 connected to bit line 426 via connector 444. Local interconnects 432 and 434 also are depicted. A portion 446 of memory hole 410 is described in more detail below and depicted in FIG. 4E.

For ease of reference, drain side select layers SGD0, SGD1, SGD2 and SGD3, source side select layers SGS0, SGS1, SGS2 and SGS3, dummy word line layers DD0, DD1, DS0, DS1, WLDL and WLDU, and word line layers WLL0-WLL111 collectively are referred to as the conductive layers. In an embodiment, the conductive layers are made from a combination of TiN and tungsten. In other embodiments, other materials can be used to form the conductive layers, such as doped polysilicon, metal such as tungsten or metal silicide. In some embodiments, different conductive layers can be formed from different materials.

Between conductive layers are dielectric layers DL0-DL127. For example, dielectric layer DL120 is above word line layer WLL110 and below word line layer WLL111. In an embodiment, the dielectric layers are made from $SiO_2$. In other embodiments, other dielectric materials can be used to form the dielectric layers.

The non-volatile memory cells are formed along memory holes which extend through alternating conductive and dielectric layers in the stack. In an embodiment, the memory cells are arranged in NAND strings. The word line layers WLL0-WLL111 connect to memory cells (also called data memory cells). Dummy word line layers DD0, DD1, DS0, DS1, WLDL and WLDU connect to dummy memory cells. A dummy memory cell does not store and is not eligible to store host data (data provided from the host, such as data from a user of the host), while a data memory cell is eligible to store host data.

In some embodiments, data memory cells and dummy memory cells may have a same structure. A dummy word line is connected to dummy memory cells. Drain side select layers SGD0, SGD1, SGD2 and SGD3 are used to electrically connect and disconnect NAND strings from bit lines.

Source side select layers SGS0, SGS1, SGS2 and SGS3 are used to electrically connect and disconnect NAND strings from the source line SL.

FIG. 4C also shows a "Joint Area." In an embodiment it is expensive and/or challenging to etch one hundred and twelve word line layers intermixed with dielectric layers. To ease this burden, one embodiment includes laying down a first stack of fifty-six word line layers alternating with dielectric layers, laying down the Joint Area, and laying down a second stack of fifty-six word line layers alternating with dielectric layers. The Joint Area is positioned between the first stack and the second stack. The Joint Area is used to connect the first stack to the second stack.

In FIG. 4C, the first stack is labeled as the "Lower Set of Word Lines" and the second stack is labeled as the "Upper Set of Word Lines." In an embodiment, the Joint Area is made from the same materials as the word line layers. In one example set of implementations, the plurality of word lines (control lines) comprises a first stack of alternating word line layers and dielectric layers, a second stack of alternating word line layers and dielectric layers, and a joint area between the first stack and the second stack.

Figure 4D:
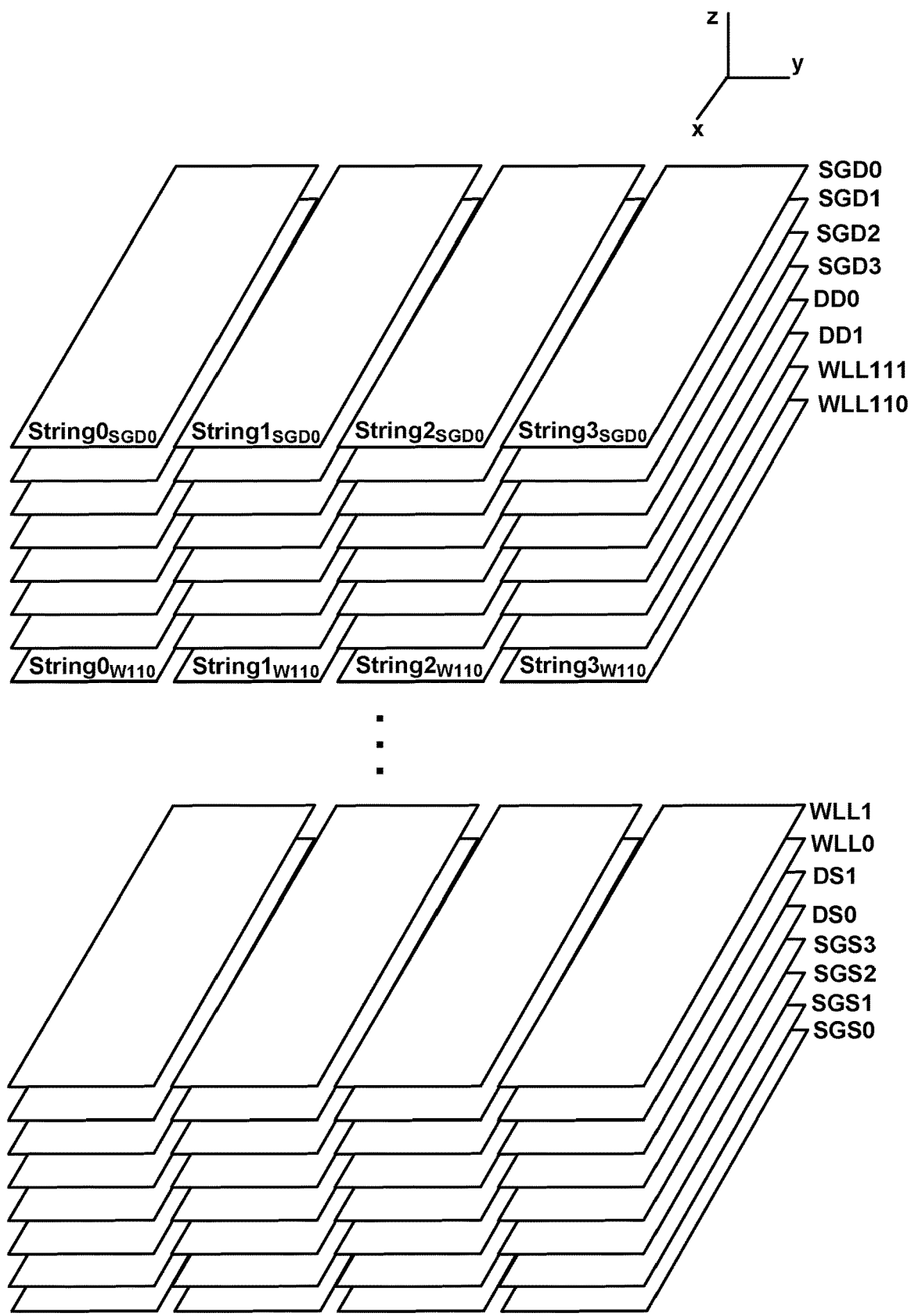
FIG. 4D depicts a view of the select gate layers and word line layers.

FIG. 4D depicts a logical representation of the conductive layers (SGD0, SGD1, SGD2, SGD3, SGS0, SGS1, SGS2, SGS3, DD0, DD1, DS0, DS1, and WLL0-WLL111) for the block that is partially depicted in FIG. 4C. As mentioned above with respect to FIG. 4B, in an embodiment local interconnects 430, 432, 434, 436 and 438 break up the conductive layers into four regions/fingers.

For example, word line layer WLL110 is divided into regions String0$_{W110}$, String1$_{W110}$, String2$_{W110}$ and String3$_{W110}$. In an embodiment, the four word line fingers on a same level are connected together. In another embodiment, each word line finger operates as a separate word line.

Likewise, drain side select gate layer SGD0 (the top layer) is divided into regions Strin0$_{SGD0}$, String1$_{SGD0}$, String2$_{SGD0}$ and String3$_{SGD0}$, also known as fingers or select line fingers. In an embodiment, the four select line fingers on a same level are connected together. In another embodiment, each select line finger operates as a separate word line.

Figure 4E:
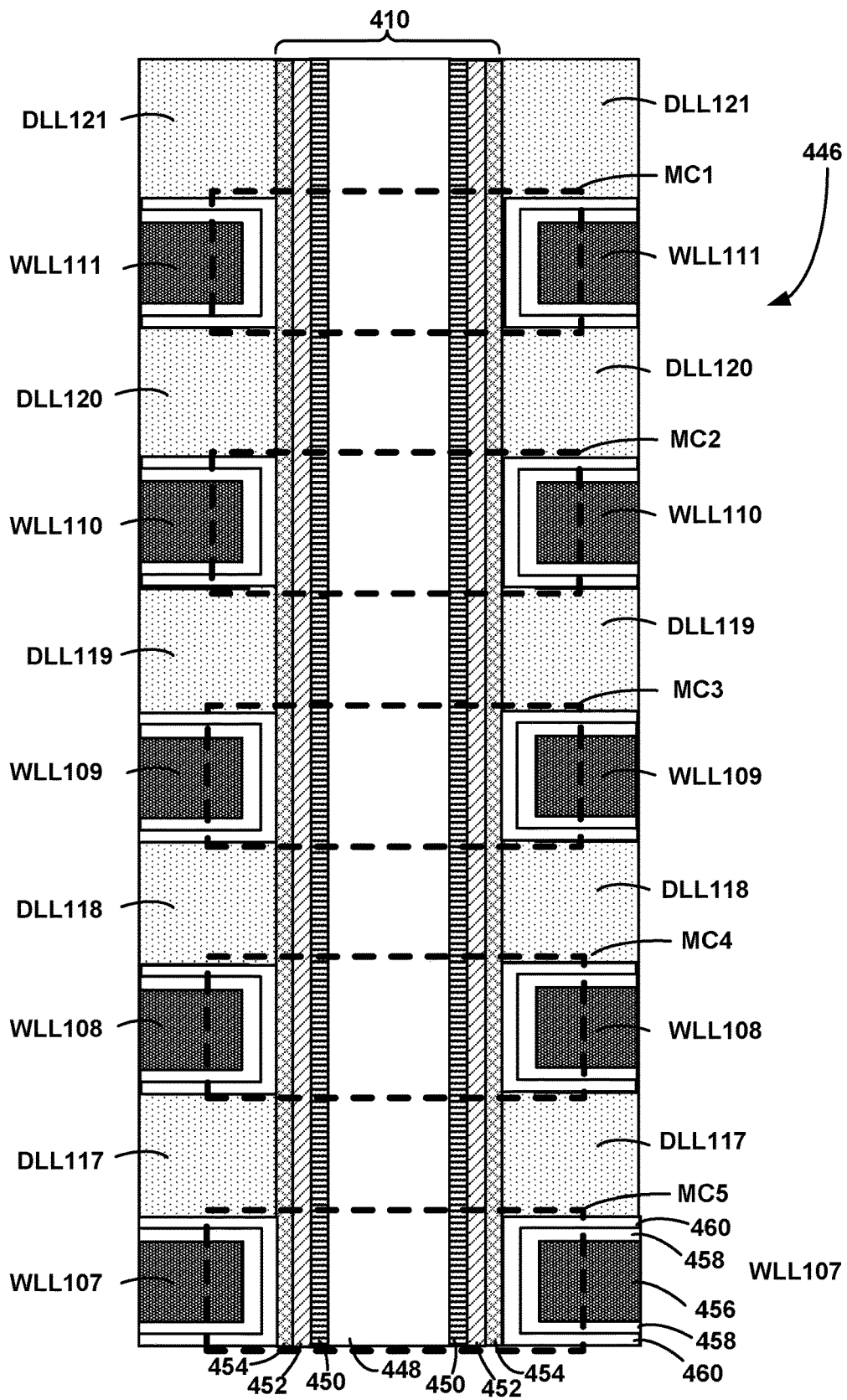
FIG. 4E is a cross sectional view of a memory hole of memory cells.

FIG. 4E depicts a cross sectional view of String1 of FIG. 4C that includes a portion 446 of memory hole 410. In an embodiment, the memory holes (e.g., memory hole 410) are shaped as cylinders. In other embodiment, however, memory holes may have other shapes. In an embodiment, memory hole 410 includes an inner core layer 448, a channel 450 surrounding inner core layer 448, a tunneling dielectric 452 surrounding channel 450, and a charge trapping layer 454 surrounding tunneling dielectric 452. In an embodiment, inner core layer 448 a dielectric material (e.g., $SiO_2$), channel 450 is polysilicon, tunneling dielectric 452 has an ONO structure, and charge trapping layer 454 is silicon nitride. Other memory materials and structures can also be used. The technology described herein is not limited to any particular material or structure.

FIG. 4E depicts dielectric layers DLL121, DLL120, DLL119, DLL118 and DLL117, as well as word line layers WLL107, WLL108, WLL109, WLL110, and WLL111. In an embodiment, each of the word line layers includes a word line region 456 surrounded by an aluminum oxide layer 458, which is surrounded by a blocking oxide ($SiO_2$) layer 460. The physical interaction of the word line layers with the memory hole forms the memory cells. Thus, a memory cell, in an embodiment, includes channel 450, tunneling dielectric 452, charge trapping layer 454, blocking oxide layer 460, aluminum oxide layer 458 and word line region 456.

For example, word line layer WLL111 and a portion of memory hole 410 comprise a memory cell MC1. Word line layer WLL110 and a portion of memory hole 410 comprise a memory cell MC2. Word line layer WLL109 and a portion of memory hole 410 comprise a memory cell MC3. Word line layer WLL108 and a portion of memory hole 410 comprise a memory cell MC4. Word line layer WLL107 and a portion of memory hole 410 comprise a memory cell MC5. In other architectures, a memory cell may have a different structure; however, the memory cell would still be the storage unit.

In an embodiment, when a memory cell is programmed, electrons are stored in a portion of the charge trapping layer 454 which is associated with the memory cell. These electrons are drawn into the charge trapping layer 454 from the channel 450, through the tunneling dielectric 452, in response to an appropriate voltage on word line region 456. The threshold voltage (Vth) of a memory cell is increased in proportion to the amount of stored charge.

In an embodiment, programming a memory cell is achieved through Fowler-Nordheim tunneling of the electrons into charge trapping layer 454. During an erase operation, the electrons return to channel 450 or holes are injected into charge trapping layer 454 to recombine with electrons. In an embodiment, erasing is achieved using hole injection into charge trapping layer 454 via a physical mechanism such as gate induced drain leakage (GIDL).

Figure 4F:
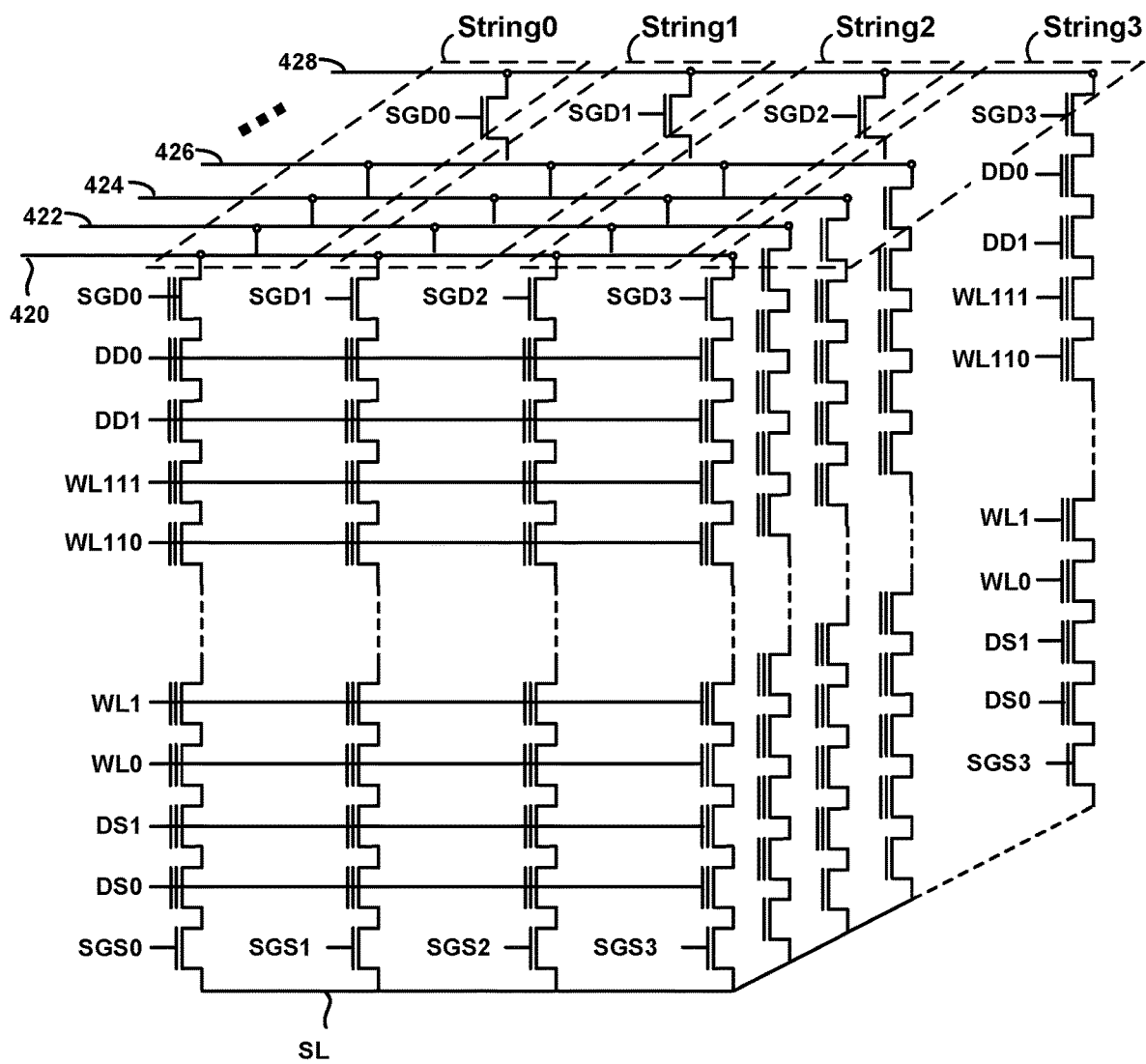
FIG. 4F is a schematic of a plurality of NAND strings.

FIG. 4F is a schematic diagram of corresponding to portion 402 in Block 2 of FIGS. 4A-E, including bit lines 420, 422, 424, 426, . . . 428, and word lines WLL0-WLL111. Within the block, each bit line is connected to four NAND strings. Drain side selection lines SGD0, SGD1, SGD2 and SGD3 are used to determine which of the four NAND strings connect to the associated bit line(s). Source side selection lines SGS0, SGS1, SGS2 and SGS3 are used to determine which of the four NAND strings connect to the common source line.

During any given memory operation, a subset of the memory cells will be identified to be subjected to one or more parts of the memory operation. These memory cells identified to be subjected to the memory operation are referred to as selected memory cells. Memory cells that have not been identified to be subjected to the memory operation are referred to as unselected memory cells. Depending on the memory architecture, the memory type, and the memory operation, unselected memory cells may be actively or passively excluded from being subjected to the memory operation.

During a memory operation some word lines are referred to as selected word lines because they are connected to selected memory cells. Unselected word lines are not connected to selected memory cells. Similarly, selected bit lines are connected to selected memory cells and unselected bit lines are not connected to selected memory cells.

Although the example memory system of FIG. 3 and FIGS. 4A-4F is a three dimensional memory structure that includes vertical NAND strings with charge-trapping material, other (2D and 3D) memory structures also can be used with the technology described herein.

Figures 5, 6:
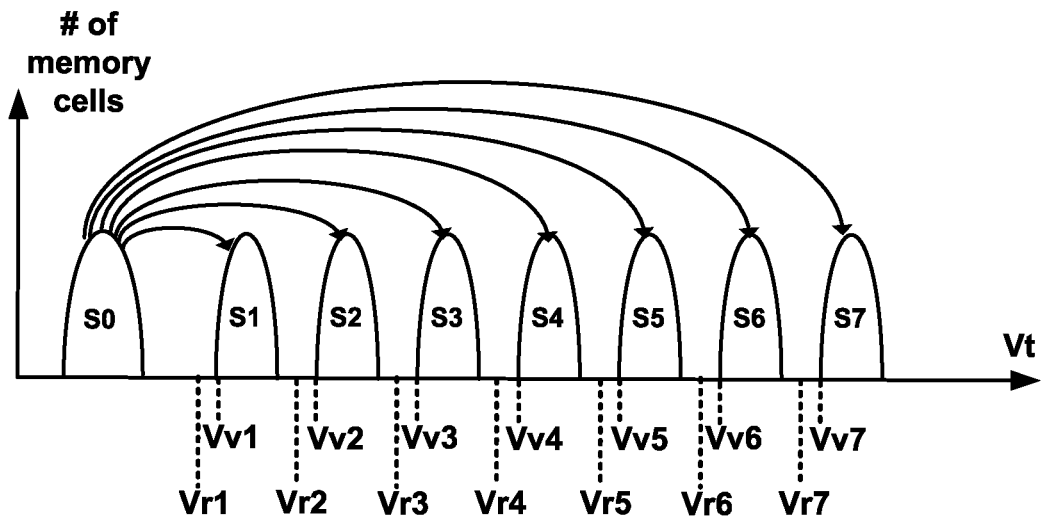
FIG. 5 depicts threshold voltage distributions.
FIG. 6 is a table describing one example of an assignment of data values to data states.

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate. FIG. 5 illustrates example threshold voltage distributions for a memory array when each memory cell stores three bits of data. Other embodiments, however, may use other data capacities per memory cell (e.g., such as one, two, four, or five bits of data per memory cell).

FIG. 5 shows eight threshold voltage distributions, corresponding to eight data states. The first threshold voltage distribution (data state) S0 represents memory cells that are erased. The other seven threshold voltage distributions (data states) S1-S7 represent memory cells that are programmed and, therefore, are also called programmed states.

Each threshold voltage distribution (data state) corresponds to predetermined values for the set of data bits. The specific relationship between the data programmed into a memory cell and the threshold voltage levels of the memory cell depends on the data encoding scheme adopted for the cells. In an embodiment, data values are assigned to the threshold voltage ranges using a Gray code assignment so that if the threshold voltage of a memory cell erroneously shifts to its neighboring physical state, only one bit will be affected.

FIG. 5 shows seven read reference voltages, Vr1, Vr2, Vr3, Vr4, Vr5, Vr6, and Vr7 for reading data from memory cells. By testing (e.g., performing sense operations) whether the threshold voltage of a given memory cell is above or below the seven read reference voltages, the system can determine what data state (S0, S1, S2, S3, ..., S7) a memory cell is in.

FIG. 5 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In an embodiment, known as full sequence programming, memory cells can be programmed from the erased data state S0 directly to any of the programmed states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 5 represent full sequence programming.

The technology described herein also can be used with other types of programming in addition to full sequence programming (including, but not limited to, multiple stage/phase programming). In some embodiments, programmed states S1-S7 can overlap, with controller 104 (FIG. 1) relying on error correction to identify the correct data being stored.

FIG. 6 is a table describing an example assignment of data values to data states. In the table of FIG. 6, S0=111, S1=110, S2=100, S3=000, S4=010, S5=011, S6=001 and S7=101. Other encodings of data also can be used. No particular data encoding is required by the technology disclosed herein. In an embodiment, when a block is subjected to an erase operation, all memory cells are moved to data state S0, the erased state. In the embodiment of FIG. 6, all bits stored in a memory cell are "1" when the memory cell is erased (e.g., in data state S0).

Figure 7:
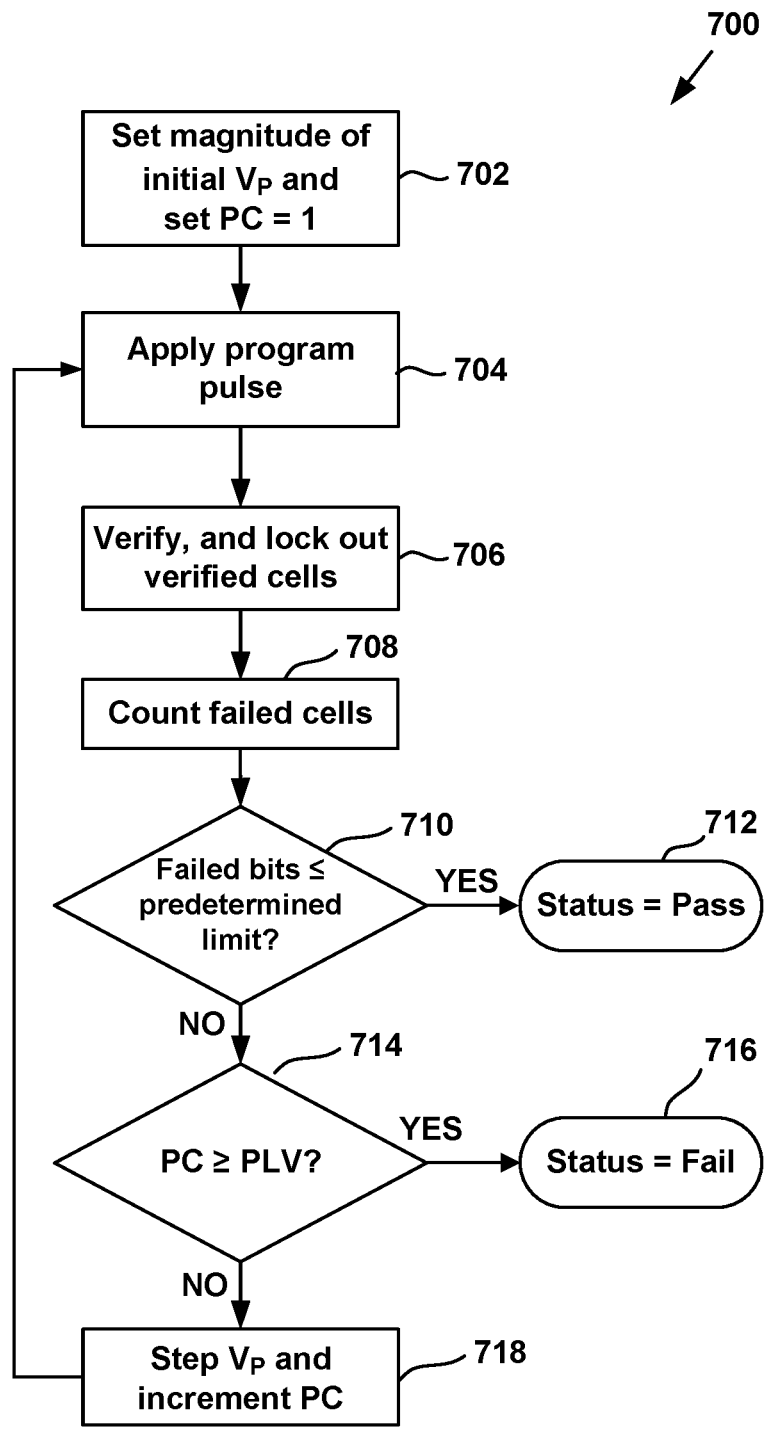
FIG. 7 is a flowchart describing an embodiment of a process for programming non-volatile memory.

FIG. 7 is a flowchart describing an embodiment of a process 700 for programming a memory cell. In an example embodiment, process 700 is performed on memory die 106 (FIG. 1) using the control circuits discussed above. For example, process 700 can be performed at the direction of state machine 216 (FIG. 2). Process 700 also can be used to implement the full sequence programming discussed above. Additionally, process 700 can be used to implement each phase of a multi-phase programming process.

Typically, a program voltage is applied to the control gates (via a selected word line) during a program operation as a series of program pulses. Between program pulses are a set of verify pulses to perform verification. In many implementations, the magnitude of the program pulses increase with each successive program pulse by a predetermined program step size. This programming technique is sometimes called incremental step pulse programming (ISPP).

In step 702 of process 700, a program voltage ($V_P$) is initialized to a starting program voltage $V_{Pinit}$ (e.g., between about 12V to about 16V, or some other value) and a program counter PC maintained by state machine 216 is initialized at 1.

In step 704, a program pulse having a magnitude $V_P$ is applied to the selected word line (the word line selected for programming). In an embodiment, the group of memory cells being concurrently programmed are all connected to the same word line (the selected word line). If a memory cell is to be programmed, then the corresponding bit line coupled to the memory cell is grounded. If a memory cell should remain at its current threshold voltage, then the corresponding bit line coupled to the memory cell is connected to Vdd to inhibit programming. In an embodiment, the unselected word lines receive one or more boosting voltages (e.g., between about 7V to about 11V, or some other value) to perform boosting schemes known in the art.

In step 704, the program pulse is applied to all memory cells connected to the selected word line so that all of the connected memory cells are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 706, the memory cells are verified using the appropriate set of verify reference voltages to perform one or more verify operations. In an embodiment, the verification process is performed by testing whether the threshold voltages of the memory cells selected for programming have reached the appropriate verify reference voltage.

In step 708, the memory system counts the number of memory cells that have not yet reached their respective target threshold voltage distribution. That is, the system counts the number of memory cells that have so far failed the verify process. This counting can be done by state machine 216 (FIG. 2), controller 104 (FIG. 1), or other logic. In the remaining discussion, the term "Controller Device" may be one or more of controller 104 of FIG. 1, control circuitry 204 of FIG. 2, state machine 216 of FIG. 2, or other similar controller device.

In an embodiment, each of sense blocks 212 (FIG. 2) stores the status (pass/fail) of their respective memory cells. In an embodiment, one total count reflects the total number of memory cells currently being programmed that have failed the last verify step. In another embodiment, separate counts are kept for each data state.

In step 710, a determination is made whether the count from step 708 is less than or equal to a predetermined limit. In an embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 712. In this situation, enough memory cells programmed correctly such that the few remaining memory cells that have not been completely programmed can be corrected using ECC during the read process.

In some embodiments, the predetermined limit used in step 710 is below the number of bits that can be corrected by error correction codes (ECC) during a read process to allow for future/additional errors. When programming less than all of the memory cells for a page, or comparing a count for only one data state (or less than all states), then the predetermined limit can be a portion (pro-rata or not pro-rata) of the number of bits that can be corrected by ECC during a read process for the page of memory cells. In some embodiments, the limit is not predetermined. Instead, the limit changes based on the number of errors already counted for the page, the number of program-erase cycles performed or other criteria.

If the number of failed memory cells is not less than the predetermined limit, then the programming process continues at step 714 and the program counter PC is checked against a program limit value (PLV). Examples of program limit values include 6, 12, 16, 20 and 30, although other values can be used. If the program counter PC is greater than or equal to program limit value PLV, then the program process is considered to have failed and a status of FAIL is reported in step 716.

If the program counter PC is not greater than or equal to program limit value PLV, then the process continues at step 718 in which the Program Counter PC is incremented by 1 and program voltage $V_P$ is stepped up to the next magnitude. For example, the next program pulse will have a magnitude greater than the previous pulse by a program step size $\Delta V_P$ (e.g., a step size of between about 0.1V to about 1.0V, or some other value). The process loops back to step 704 and another program pulse is applied to the selected word line so that another iteration (steps 704-718) of programming process 700 is performed. Each pass through steps 704-718 is referred to herein as a "program loop."

In general, during verify operations and read operations, the selected word line is connected to a voltage (one example of a reference signal), a level of which is specified for each read operation (e.g., read compare levels Vr1, Vr2, Vr3, Vr4, Vr5, Vr6, and Vr7, of FIG. 5) or verify operation (e.g. verify target levels Vv1, Vv2, Vv3, Vv4, Vv5, Vv6, and Vv7 of FIG. 5) to determine whether a threshold voltage of the selected memory cell has reached such level.

In an embodiment, after an appropriate read or verify voltage is applied to a selected word line, a conduction current of the memory cell is measured to determine whether the memory cell turned ON (conducts current) in response to the voltage applied to the word line. If the conduction current is measured to be greater than a certain value, then it is assumed that the memory cell turned ON and the voltage applied to the word line is greater than the threshold voltage of the memory cell.

If the conduction current is measured to be not greater than the certain value, then the memory cell did not turn ON, and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate at which the memory cell discharges or charges a dedicated capacitor in a sense amplifier. In another example, the conduction current of the selected memory cell allows (or fails to allow) the NAND string that includes the memory cell to discharge a corresponding bit line. The voltage on the bit line is measured after a period of time to see whether or not the bit line has been discharged. Note that the technology described herein can be used with different methods known in the art for verifying/reading. Other read and verify techniques known in the art also can be used.

As described above, at step 704 a program pulse is applied to the selected word line, and at step 706 memory cells coupled to the selected word line are verified using an appropriate set of verify reference voltages to perform one or more verify operations. Steps 704 and 706 are part of an iterative loop in which program pulses are applied as a series of program pulses that step up in magnitude, with intervening verify reference pulses between consecutive program pulses. Such an iterative loop is referred to herein as a "program-verify iteration."

Figure 8A:
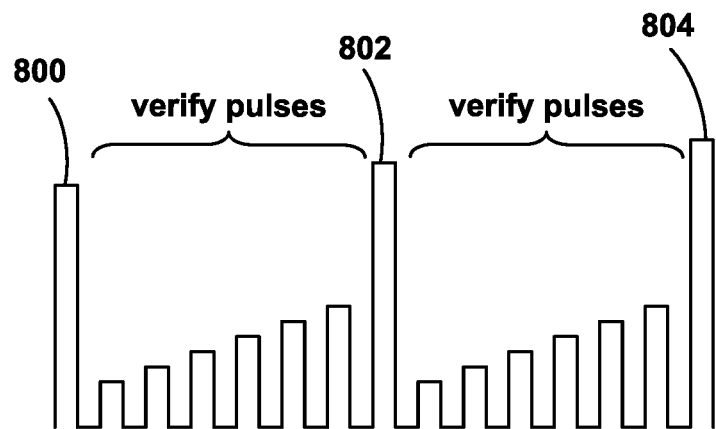
FIG. 8A depicts a word line voltage during programming and verify operations.
Figure 8B:
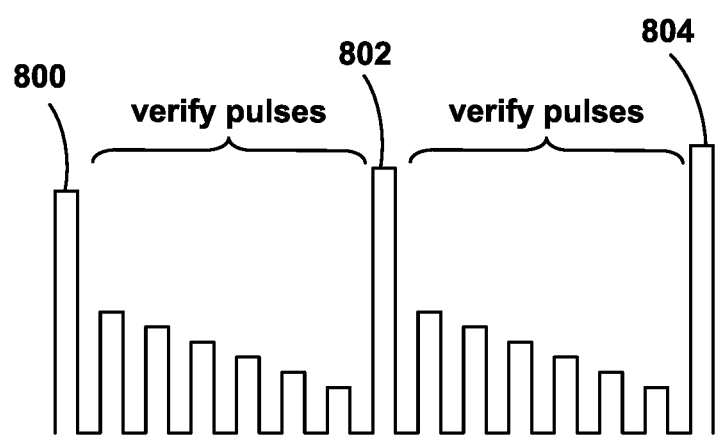
FIG. 8B depicts another word line voltage during programming and verify operations.

FIG. 8A illustrates an example of such program-verify pulses applied to a selected word line. In particular, FIG. 8A depicts program pulses 800, 802 and 804 applied to the selected word line during three successive iterations of step 704 of FIG. 7. Between program pulses 800, 802 and 804 verify pulses are applied to the selected word line during three successive program-verify iterations of steps 704-706 of FIG. 7 to determine whether threshold voltages of the memory cells are greater than the respective verify reference voltages. FIG. 8B illustrates another example of such program-verify pulses applied to a selected word line, in which the order of the verify pulses is reversed compared with those of FIG. 8A.

FIGS. 8A-8B each show a verify pulse for each of the programmed states S1-S7 between each of program pulses 800, 802 and 804. These verify pulses consume a significant portion of a program operation. As the number of programmed states stored per memory cell increases, this situation becomes worse, limiting programming speed. FIGS. 8A-8B correspond to memory cells that store 3-bits per cell and require 7 verify levels. In a 4-bit per cell embodiment, a verify of all non-erased states would need 15 verify operations between program pulses.

To improve performance, some verify operations can be omitted during the programming operation through use of smart-verify algorithms to reduce programming time. For example, an embodiment of a smart-verify operation for word line WLn performs a program-verify iteration on memory cells of String0 coupled to word line WLn.

In an embodiment, the program-verify iteration determines a minimum number of program loops (referred to herein as "smart-verify loop count") needed to program memory cells of String0 to a particular programmed state (e.g., the lowest programmed state S1 in FIG. 5). The process of determining a smart-verify loop count is also referred to herein as "smart-verify acquisition," and the determined smart-verify loop count is also referred to herein as the acquired smart-verify loop count.

The acquired smart-verify loop count is then used to determine a smart-verify starting program voltage for programming memory cells of String1-String3 coupled to word line WLn. In particular, the smart-verify starting program voltage $V_{PSn}$ for memory cells of String1-String3 coupled to word line WLn is:

$$V_{PSn} = V_{Pinit} + \text{SVloop}_n \times \Delta V_{PS} \quad (1)$$

where $\text{SVloop}_n$ is the acquired smart-verify loop count for word line WLn, and $\Delta V_{PS}$ is a program step size for smart-verify (e.g., a step size of between about 0.1V to about 1.0V, or some other value). That is, the determined smart-verify starting program voltage $V_{PSn}$ for memory cells of String1-String3 coupled to word line WLn is initial program voltage $V_{Pinit}$ plus the acquired smart-verify loop count multiplied by program step size for smart-verify $\Delta V_{PS}$. In some embodiments, program step size for smart-verify $\Delta V_{PS}$ may have a same or a different value than program step size $\Delta V_P$. For example, in an embodiment program step size for smart-verify $\Delta V_{PS}$ is less than program step size $\Delta V_P$.

This same process is repeated for each subsequent word line (e.g., word lines WLn+1, WLn+2, . . . ), first performing a program-verify iteration on memory cells of String0 coupled to the word line to acquire a smart-verify loop count for those memory cells, and then using the acquired smart-verify loop count to determine a smart-verify starting program voltage $V_{PSn}$ for programming memory cells of String1-String3 coupled to the word line.

As described above, verify processes consume a significant portion of a program operation. To improve performance, some programming techniques for non-volatile memory devices do not perform any verify operations. For SLC memory devices, such programming techniques are sometimes referred to as "one program pulse, zero verify" or "1P0V." In embodiments, 1P0V may be used to program SLC memory devices that may be programmed/erased between an erased state (Er) and a programmed state (S1).

For MLC memory devices, such as memory cell used to store two bits of data, such programming techniques are sometimes referred to as "three program pulse, zero verify" or "3P0V." In embodiments, 3P0V may be used to program MLC memory devices that may be programmed/erased between an erased state (Er) and a first programmed state (A), a second programmed state (B), a third programmed state (B).

Zero verify programming techniques, such as the 1P0V and 3P0V programming techniques described above result in memory cells that have "natural threshold voltage distributions." As used herein, a natural threshold voltage distribution of a set of memory cells is the threshold voltage distribution obtained if a program pulse is applied to the word line without any program-verify operation. In other words, a natural threshold voltage distribution depicts the threshold voltages at which the cells program to "naturally," and reflects the natural physical and electrical variations of the large number of memory cells.

Figure 9A:
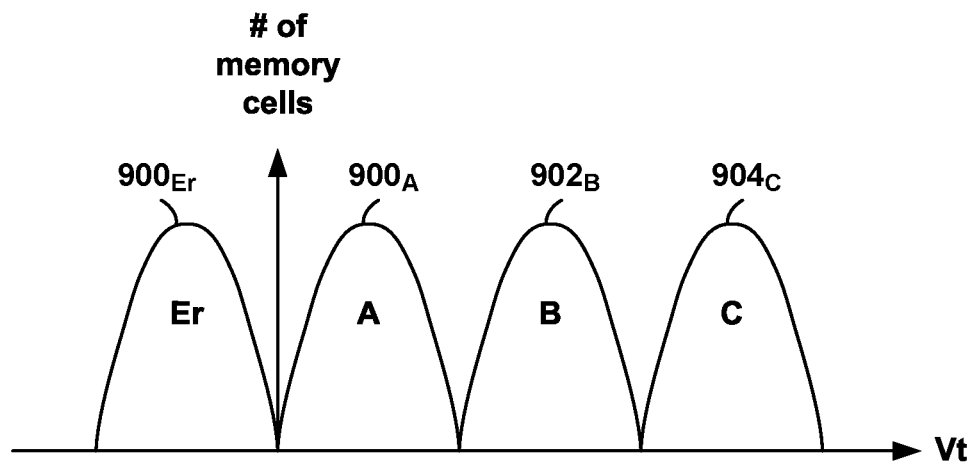
FIG. 9A depicts an example natural threshold distribution of memory cells that store two bits of data.

For example, FIG. 9A illustrates an example natural threshold distribution of memory cells that store two bits of data and are programmed using a 3P0V technique. In particular, FIG. 9A depicts four threshold voltages distributions $900_{Er}$, $900_A$, $900_B$ and $900_C$, corresponding to four data states Er, A, B and C, respectively. The first threshold voltage distribution $900_{Er}$ represents memory cells that are erased. The three natural threshold voltage distributions $900_A$, $900_B$ and $900_C$ represent memory cells that are programmed using an example 3P0V technique.

Figure 10A:
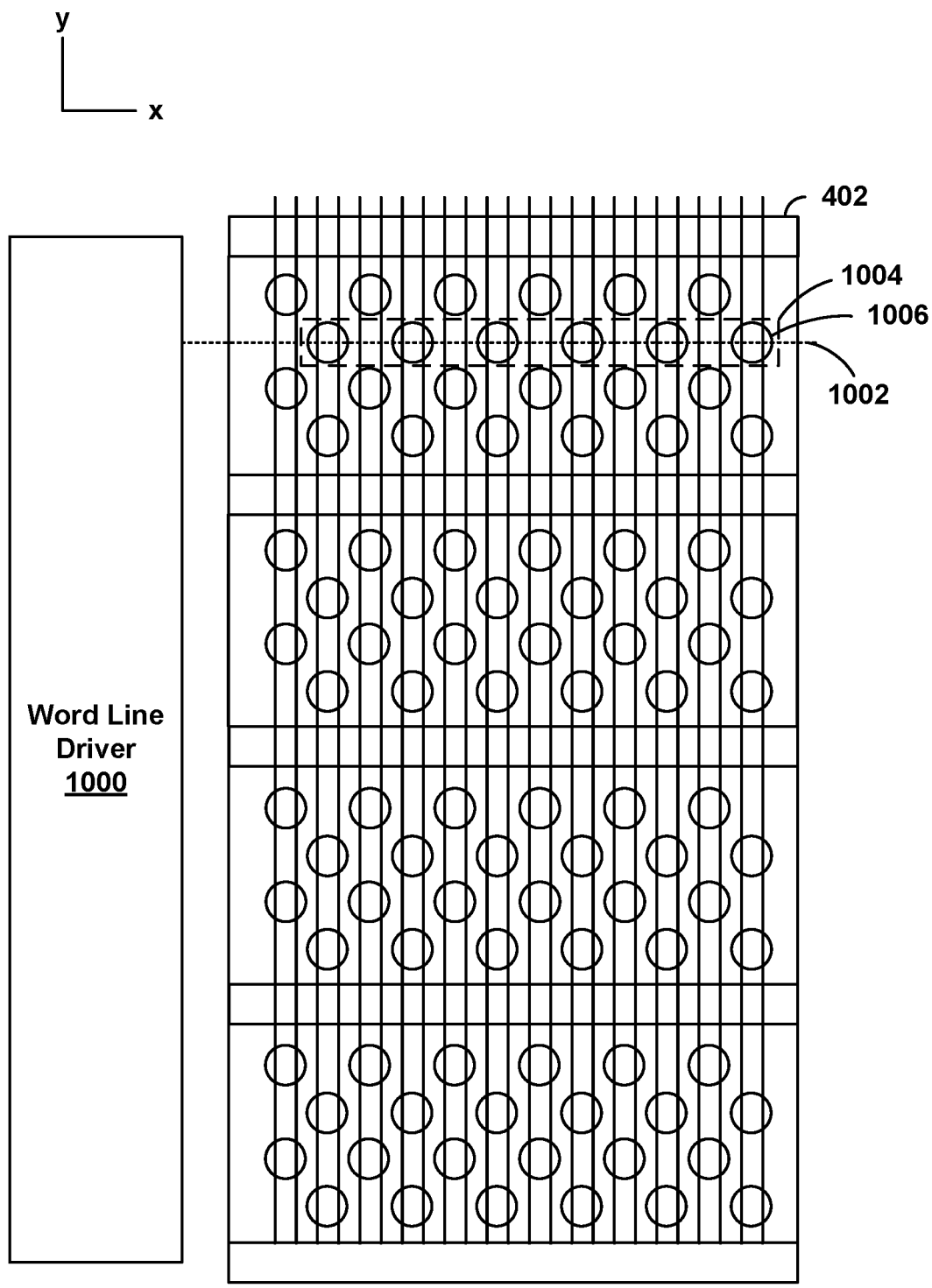
FIG. 10A depicts a top view of a portion of a block of memory cells.

FIG. 10A is a block diagram depicting another top view of portion 402 of block 2 (FIG. 4A) of memory structure 202. FIG. 10A is similar to FIG. 4B, but also includes a word line driver 1000 that provides multiple word lines, each are coupled to a corresponding row of the memory holes of portion 402. To avoid overcrowding the drawing, FIG. 10A only depicts a single word line 1002 coupled to the corresponding row 1004 of memory holes that includes memory hole 1006.

Ideally, word lines have no parasitic resistance or capacitance. In reality, however, actual word lines such as word line 1002 have a non-negligible parasitic resistance and capacitance. The amount of resistive-capacitive loading on word line 1002 as seen by the word line driver 1000 increases with increasing distance along word line 1002 from word line driver 1000. The resistive-capacitive loading of actual word lines is particularly significant as required programming times decrease. point In particular, during a programming operation selected word lines are typically ramped up from a first voltage (e.g., 0V) to a second voltage (e.g., program voltage $V_P$). The portion of a word line closest to the word line driver (e.g., word line driver 1000) has relatively low resistive-capacitive loading as seen by the word line driver 1000, and ramps up very quickly to program voltage $V_P$. In contrast, the portion of a word line farthest from word line driver 1000 has larger resistive-capacitive loading as seen by the word line driver 1000, and thus ramps up more slowly to program voltage $V_P$. More generally, the voltage ramping will vary along the length of each word line.

Figure 10B:
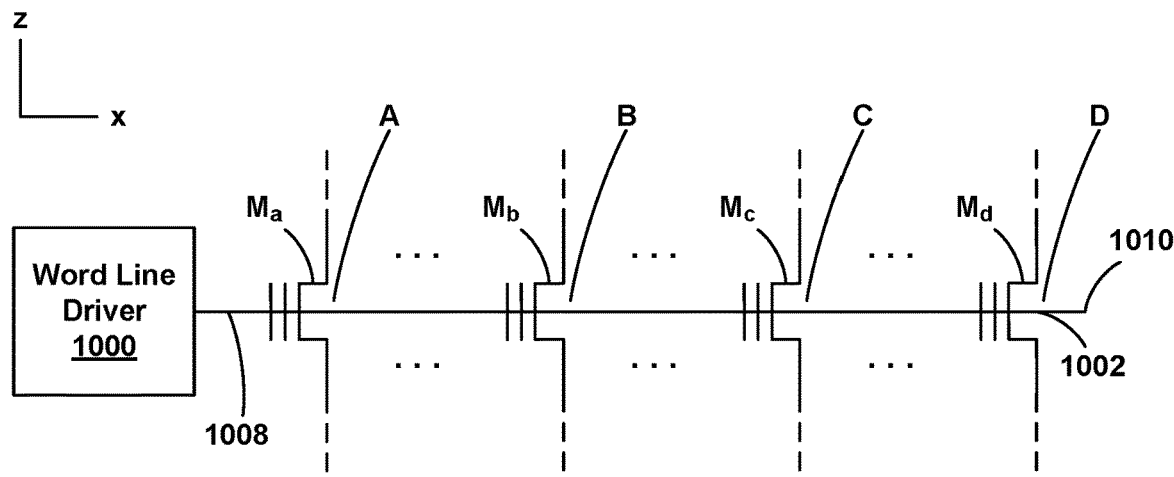
FIG. 10B depicts a simplified view of memory cells coupled to a word line.

For example, FIG. 10B depicts a simplified view of memory cells $M_a$, $M_b$, $M_c$, $M_d$ coupled to word line 1002. Word line 1002 has a first end 1008 coupled to word line driver 1000, and a second end 1010. Memory cells $M_a$, $M_b$, $M_c$, $M_d$ span the length of word line 1002 from first end 1008 to second end 1010. Memory cell $M_a$ is located at a first portion A of word line 1002 closest to word line driver 1000. Memory cell $M_b$ is located at a second portion B of word line 1002 farther from word line driver 1000. Memory cell $M_c$ is located at a third portion B of word line 1002 still farther from word line driver 1000. Memory cell $M_d$ is located at a fourth portion D of word line 1002 farthest from word line driver 1000.

Figure 10C:
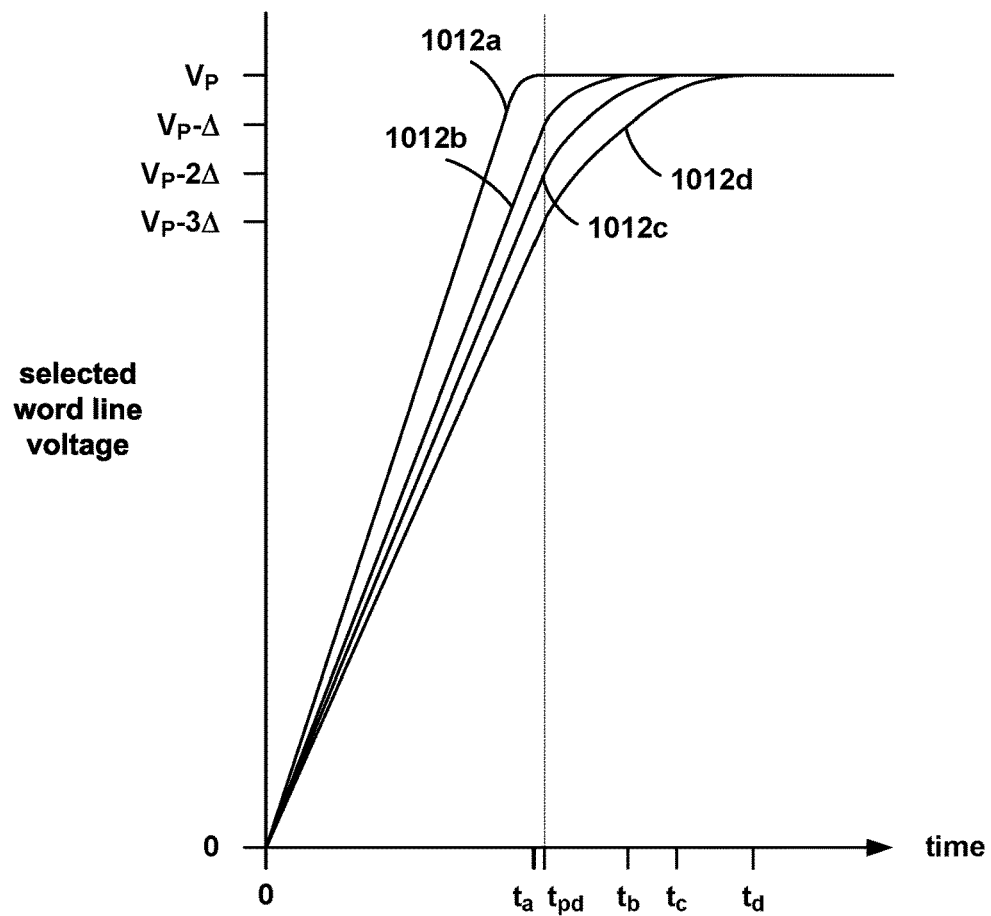
FIG. 10C depicts example curves of word line voltage versus time for various portions of the word line of FIG. 10B.

FIG. 10C depicts example curves of word line voltage versus time for various portions of word line 1002. In particular, first curve 1012a corresponds to first portion A of word line 1002, second curve 1012b corresponds to second portion B of word line 1002, third curve 1012c corresponds to third portion C of word line 1002, and fourth curve 1012d corresponds to fourth portion D of word line 1002. First curve 1012a reaches program voltage $V_P$ at a first time $t_a$, second curve 1012b reaches program voltage $V_P$ at a second time $t_b$, third curve 1012c reaches program voltage $V_P$ at a third time $t_c$, and fourth curve 1012d reaches program voltage $V_P$ at a fourth time $t_d$.

Word line driver 1000 applies program pulses having a pulse duration $t_{pd}$ to selected word lines (such as word line 1002 of FIG. 10B). For increased performance in terms of programming speed, pulse duration $t_{pd}$ is desirably as small as possible. In the example of FIGS. 10C, pulse duration $t_{pd}$ is greater than first time $t_a$, but is less than second time $t_b$, third time $t_c$, and fourth time $t_d$.

As a result, at the end of the program pulse at time $t=t_{pd}$ first portion A of word line 1002 is at program voltage $V_P$, second portion B of word line 1002 is at a voltage $V_P-\Delta$, third portion C of word line 1002 is at a voltage $V_P-2\Delta$, and fourth portion D of word line 1002 is at a voltage $V_P-3\Delta$.

In this regard, at the end of the program pulse at time $t=t_{pd}$ the voltage of each of portions A-D varies based on distance between word line driver 1000 and the particular word line portion. In other words, as the distance between word line driver 1000 and the particular word line portion increases, the voltage of the word line portion at the end of the program pulse at time $t=t_{pd}$ decreases.

Stated another way, at the end of the program pulse at time $t=t_{pd}$ the voltage of each of portions A-D varies based on an amount of resistive-capacitive loading at the particular word line portion as seen by the word line driver 1000. In other words, as the amount of resistive-capacitive loading at the particular word line portion as seen by the word line driver 1000 increases, the voltage of the word line portion at the end of the program pulse at time $t=t_{pd}$ decreases.

As described above, in a conventional programming operation program pulses at program voltage $V_P$ are applied to the selected word line, all selected bit lines are biased to a selected bit line voltage $V_{SB}$ (e.g., $V_{SB}=0V$), and unselected bit lines are biased to an inhibit voltage (e.g., Vdd). A voltage difference between the word line voltage and the selected bit line voltage is the effective program voltage applied to the selected memory cells. In the example of FIG. 10B, with $V_{SB}=0V$ the effective program voltage applied to selected memory cells $M_a$, $M_b$, $M_c$, and $M_d$ are $V_P$, $V_P-\Delta$, $V_P-2\Delta$, and $V_P-3\Delta$, respectively.

Thus, in a conventional programming operation a larger program voltage is applied to memory cells closer to word line driver 1000 (e.g., memory cells $M_a$ and $M_b$) and a smaller program voltage is applied to memory cells farther from word line driver 1000 (e.g., memory cells $M_c$ and $M_d$). As a result, memory cells closer to word line driver 1000 (e.g., memory cells $M_a$ and $M_b$) have a higher threshold voltage shift than memory cells farther from word line driver 1000 (e.g., memory cells $M_c$ and $M_d$). A result is a broadening of the threshold voltage distributions corresponding to the programmed data states.

Figure 9B:
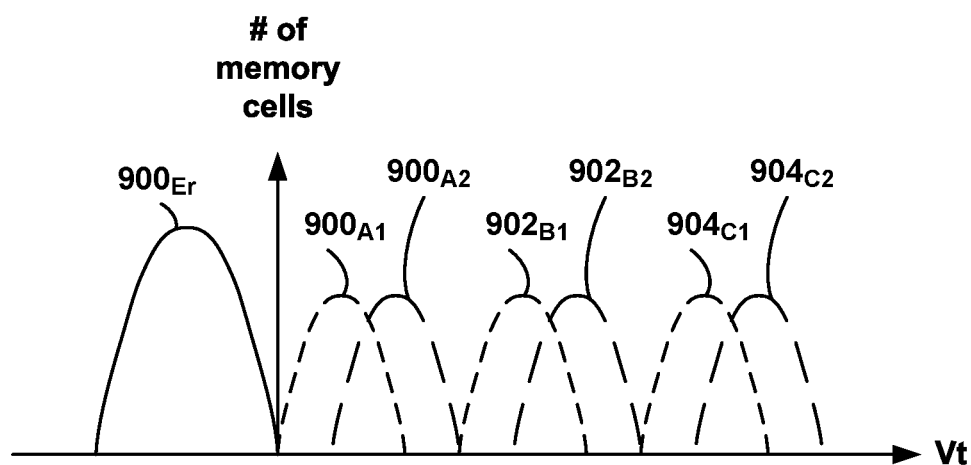
FIG. 9B depicts an example natural threshold distribution of memory cells that store two bits of data.

For example, FIG. 9B illustrates an example natural threshold distribution of memory cells that store two bits of data and are programmed using a 3P0V technique, including the effects of word line parasitic resistance and capacitance. In the illustrated example, the natural threshold voltage distribution corresponding to data state A (which is depicted as a single threshold voltage distribution $900_A$ in FIG. 9A) divides into two overlapping threshold voltage distributions $900_{A1}$ and $900_{A2}$.

Similarly, the natural threshold voltage distribution corresponding to data state B (which is depicted as a single threshold voltage distribution $900_B$ in FIG. 9A) divides into two overlapping threshold voltage distributions $900_{B1}$ and $900_{B2}$. Likewise, the natural threshold voltage distribution corresponding to data state C (which is depicted as a single natural voltage distribution $900_C$ in FIG. 9A) divides into two overlapping threshold voltage distributions $900_{C1}$ and $900_{C2}$. A consequence of the broadening of the threshold voltage distributions is reduced margins for distinguishing between the various programmed data states.

In addition, as memory cells are subjected to increasing numbers of program-erase cycles, the memory cells experience increasing data retention loss. Also, data retention loss increases with increasing program voltage. Thus, in a conventional programming operation memory cells closer to word line driver 1000 (e.g., memory cells $M_a$ and $M_b$) experience greater data retention loss with cycling than memory cells farther from word line driver 1000.

Technology is described for use during a programming operation to compensate for the variation of selected word line voltage that results from increased resistive-capacitive loading along the word line with increasing distance from the word line driver. As described above, in a conventional programming operation all selected bit lines are biased to selected bit line voltage $V_{SB}$ (e.g., $V_{SB}=0V$). In contrast, in the disclosed technology selected bit lines are not all biased to the same voltage. Instead, in an embodiment during programming each selected bit line is biased to a corresponding selected bit line voltage.

The remaining text describes various embodiments in which each selected bit line is biased to a corresponding selected bit line voltage. In the various embodiments, a Controller Device (e.g., one or more of controller 104 of FIG. 1, control circuitry 204 of FIG. 2, state machine 216 of FIG. 2, or other similar controller device) may be used to bias selected bit lines to corresponding selected bit line voltages.

In an embodiment, each corresponding selected bit line voltage has a value that varies based on a distance between the word line driver and the corresponding bit line. In other words, during programming selected bit lines are not all biased to the same selected bit line voltage.

In an embodiment, each corresponding selected bit line voltage has a unique value that varies based on a distance between the word line driver and the corresponding bit line. In other words, during programming no two selected bit lines are biased to the same selected bit line voltage.

In an embodiment, each corresponding selected bit line voltage has a value that decreases with increasing distance between the word line driver and the corresponding bit line.

As described above, the amount of resistive-capacitive loading on word line 1002 as seen by the word line driver 1000 increases with increasing distance along word line 1002 from word line driver 1000. In an embodiment, each corresponding selected bit line voltage has a value that varies based on an amount of resistive-capacitive loading on word line 1002 at a vicinity of the selected bit line as seen by the word line driver 1000.

For example, in a memory array includes N bit lines $B_0$, $B_1$, $B_2$, $B_3$, ..., $B_{N-2}$, $B_{N-1}$, during programming the selected bit lines are biased to corresponding unique selected bit line voltages $VB_{S0}$, $VB_{S1}$, $VB_{S2}$, $VB_{S3}$, ..., $VB_{SN-2}$, $VB_{SN-1}$. Of these N bit lines, during programming the selected bit lines are biased to unique selected bit line voltages having a value that varies based on a distance between the word line driver and the corresponding bit line, and the unselected bit lines are biased to an inhibit voltage (e.g., Vdd).

Figure 11:
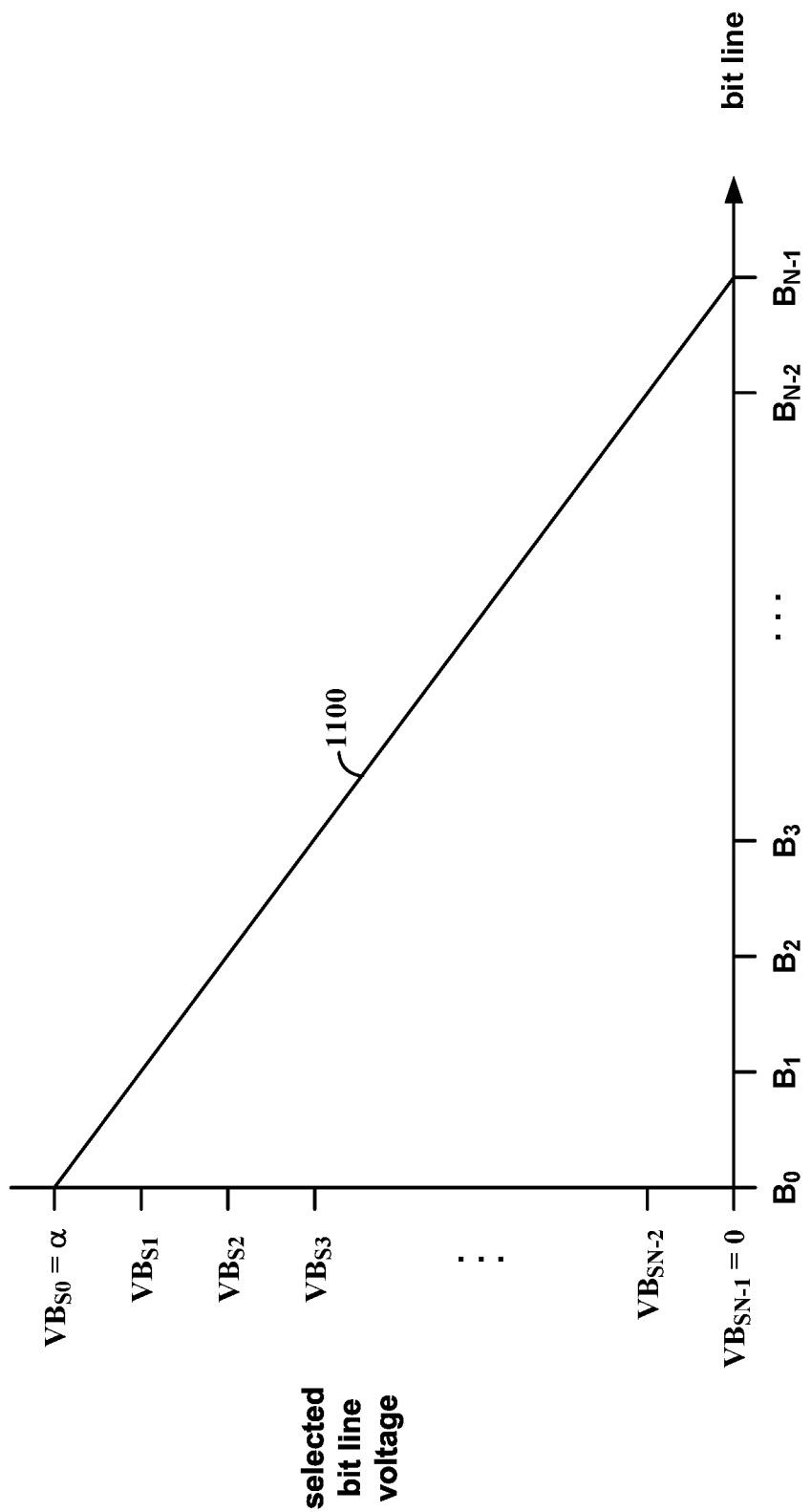
FIG. 11 depicts a diagram of selected bit line voltage versus bit line.

For example, FIG. 11 depicts a diagram of selected bit line voltage versus bit line. In an embodiment, bit line $B_0$ is closest to the word line driver and bit line $B_{N-1}$ is farthest from the word line driver. In this example, bit line $B_0$ has a corresponding unique selected bit line voltage $VB_{S0}=\alpha V$, and bit line $B_{N-1}$ has a corresponding unique selected bit line voltage $VB_{S0}=0V$. In an embodiment, the value of $\alpha$ may be determined empirically, from simulations, or from some other technique. For example, in the example depicted in FIG. 10C the voltage of fourth portion D of word line 1002 at the end of the program pulse at time $t=t_{pd}$ is $V_P-3\Delta$. If this value was determined by empirically measuring the voltage of word line 1002 at second end 1010 adjacent bit line $B_{N-1}$, the value of α may be set to $\alpha=3\Delta$.

As described above, the effective program voltage $V_{PE}$ applied to a selected memory cell is a voltage difference between the word line voltage and the selected bit line voltage coupled to the memory cell. Thus, if $\alpha=3\Delta$, the effective program voltage $V_{PE}$ applied to selected memory cells coupled to bit line $B_0$ at time $t=t_{pd}$ is $V_{PE}=(V_P-V_{BS0})=(V_P-3\Delta)$. Likewise, the effective program voltage $V_{PE}$ applied to selected memory cells coupled to bit line $B_{N-1}$ at time $t=t_{pd}$ is $V_{PE}=(V_P-V_{BSN-1})=(V_P-3\Delta-0)=(V_P-3\Delta)$. Thus, the same effective program voltage $V_{PE}$ applied to selected memory cells coupled to selected bit lines $B_0$ and $B_{N-1}$ at time $t=t_{pd}$.

To a first order, the rise time delay between first end 1008 and second end 1010 of word line 1002 may be linear. Accordingly, in an embodiment a straight line 1100 is drawn between αV and 0V, and line 1100 is used to determine the corresponding unique selected bit line voltages for bit lines $B_1, B_2, B_3, \ldots, B_{N-2}$. In an embodiment, to a first order the effective program voltage $V_{PE}$ applied to selected memory cells coupled to selected bit lines $B_1, B_2, B_3, \ldots, B_{N-2}$ at time $t=t_{pd}$ is $(V_P-3\Delta)$. As a result, without wanting to be bound by any particular theory, it is believed that the same effective program voltage is applied to all selected memory cells along word line 1002.

In the embodiment described above, during programming each selected bit line is biased to a corresponding selected bit line voltage that has a value that varies based on a distance between the word line driver and the corresponding bit line. In an alternative embodiment, bit lines are arranged in groups (referred to herein as "bit line groups") and during programming selected bit lines in a bit line group are biased to a corresponding selected bit line voltage for that group (referred to herein as the "group selected bit line voltage").

In an embodiment, each group selected bit line voltage has a value that varies based on a distance between the word line driver and the corresponding bit line group. In an embodiment, each group selected bit line voltage has a unique value that varies based on a distance between the word line driver and the corresponding bit line group. In an embodiment, each group selected bit line voltage has a value that decreases with increasing distance between the word line driver and the corresponding bit line group.

Figure 12:
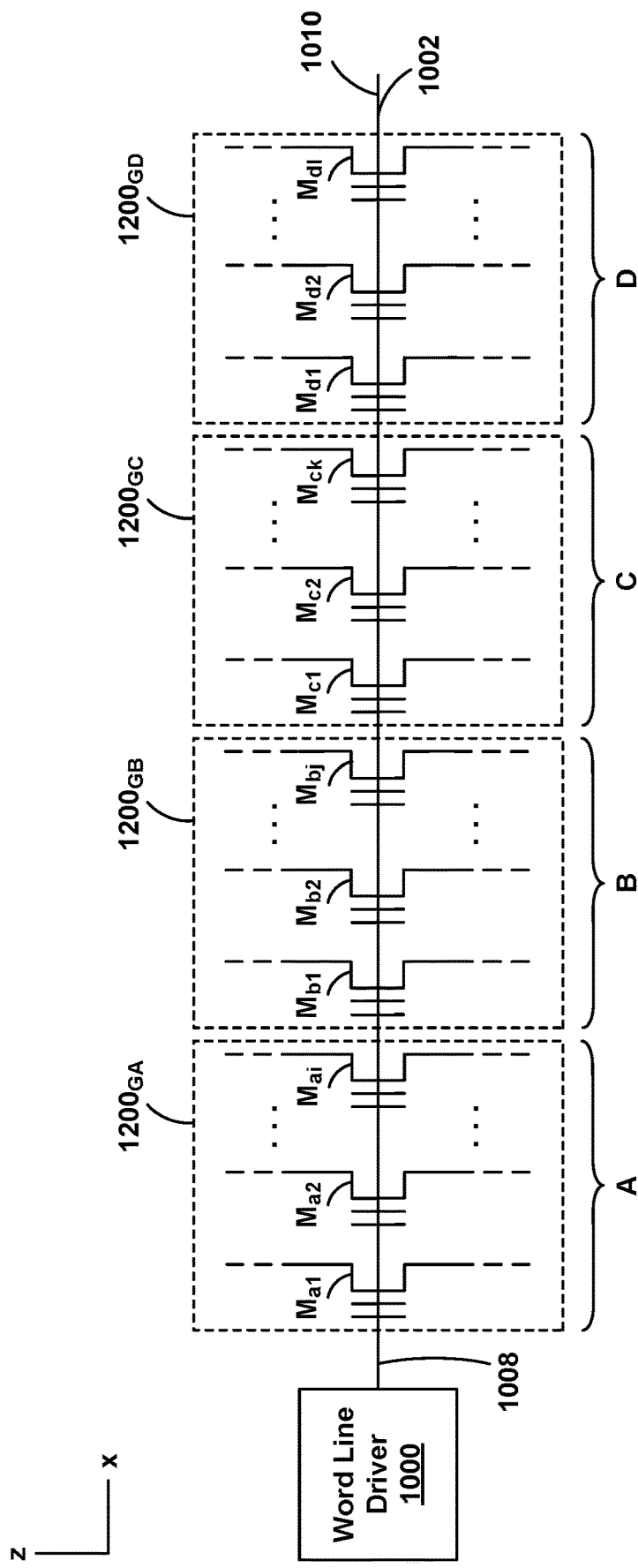
FIG. 12 depicts a simplified view of bit line groups of memory cells coupled to a word line.

In an embodiment, a memory array that includes N bit lines $B_0, B_1, B_2, B_3, \ldots, B_{N-2}, B_{N-1}$ may be divided into M groups, where M=2, 3, . . . , N. For example, FIG. 12 depicts a simplified view of M=4 bit line groups 1200$_{GA}$, 1200$_{GB}$, 1200$_{GC}$ and 1200$_G$ of memory cells coupled to word line 1002. Word line 1002 has a first end 1008 coupled to word line driver 1000, and a second end 1010. In the illustrated example, bit line group 1200$_{GA}$ includes memory cells $M_{a1}, M_{a2}, \ldots, M_{ai}$, bit line group 1200$_{GB}$ includes memory cells $M_{b1}, M_{b2}, \ldots, M_{bj}$, bit line group 1200$_{GC}$ includes memory cells $M_{c1}, M_{c2}, \ldots, M_{ck}$, and bit line group 1200$_{GD}$ includes memory cells $M_{d1}, M_{d2}, \ldots, M_{dl}$. Memory cells $M_{a1}, M_{a2}, \ldots, M_{ai}, M_{b1}, M_{b2}, \ldots, M_{bj}, M_{c1}, M_{c2}, \ldots, M_{ck}$, and $M_{d1}, M_{d2}, \ldots, M_{dl}$ span the length of word line 1002 from first end 1008 to second end 1010.

In an embodiment, bit line groups 1200$_{GA}$, 1200$_{GB}$, 1200$_{GC}$ and 1200$_{GD}$ include j, k and l bit lines, respectively, and i, j, k and l memory cells, respectively. In an embodiment, bit line groups 1200$_{GA}$, 1200$_{GB}$, 1200$_{GC}$ and 1200$_{GD}$ include a same number of bit lines and memory cells (e.g., i=j=k=l). In other embodiments, one or more of bit line groups 1200$_{GA}$, 1200$_{GB}$, 1200$_{GC}$ and 1200$_{GD}$ includes a different number of bit lines and memory cells (e.g., i≠j≠k≠l).

In an embodiment, memory cells $M_{a1}, M_{a2}, \ldots, M_{ai}$ of bit line group 1200$_{GA}$ are coupled to a first portion A of word line 1002 closest to word line driver 1000, memory cells $M_{b1}, M_{b2}, \ldots, M_{bj}$ of bit line group 1200$_{GB}$ are coupled to a second portion B of word line 1002 farther from word line driver 1000, memory cells $M_{c1}, M_{c2}, \ldots, M_{ck}$ of bit line group 1200$_{GC}$ are coupled to a third portion C of word line 1002 still farther from word line driver 1000, and memory cells $M_{d1}, M_{d2}, \ldots, M_{dl}$ of bit line group 1200$_{GD}$ are coupled to a fourth portion D of word line 1002 farthest from word line driver 1000.

In an embodiment, each bit line group has a corresponding group selected bit line voltage $VGB_{SA}$. For example, group 1200$_{GA}$ has a corresponding group selected bit line voltage $VGB_{SA}$, group 1200$_{GB}$ has a corresponding group selected bit line voltage $VGB_{SB}$, group 1200$_{GC}$ has a corresponding group selected bit line voltage $VGB_{SC}$, and group 1200$_{GD}$ has a corresponding group selected bit line voltage $VGB_{SD}$.

In an embodiment, each group selected bit line voltage has a value that varies based on a distance between the word line driver and the corresponding bit line group. In an embodiment, each group selected bit line voltage has a unique value that varies based on a distance between the word line driver and the corresponding bit line group. In other words, during programming no two bit lines from separate bit line groups are biased to the same group selected bit line voltage.

For example, during programming all selected bit lines of bit line group 1200$_{GA}$ are biased to group selected bit line voltage $VGB_{SA}$, all selected bit lines of bit line group 1200$_{GB}$ are biased to group selected bit line voltage $VGB_{SB}$, all selected bit lines of bit line group 1200$_{GC}$ are biased to group selected bit line voltage $VGB_{SC}$, all selected bit lines of bit line group 1200$_{GD}$ are biased to group selected bit line voltage $VGB_{SD}$, and all unselected bit lines are biased to an inhibit voltage (e.g., Vdd).

For the embodiment of FIG. 12, group selected bit line voltage $VGB_{SA}$ may have a value $VGB_{SA}=3\Delta$, group selected bit line voltage $VGB_{SB}$ may have a value $VGB_{SB}=2\Delta$, group selected bit line voltage $VGB_{SC}$ may have a value $VGB_{SC}=\Delta$, and group selected bit line voltage $VGB_{SD}$ may have a value $VGB_{SD}=0$, the same values from the example of FIG. 10C.

As described above, the effective program voltage $V_{PE}$ applied to a selected memory cell is a voltage difference between the word line voltage and the selected bit line voltage coupled to the memory cell. Thus, using the example group selected bit line voltage values from above and from the word line voltage values of FIG. 10C, at time $t=t_{pd}$ the effective program voltage $V_{PE}$ applied to selected memory cells coupled to selected bit lines in bit line group 1200$_{GA}$ is $V_{PE}=(V_P-VGB_{SA})=(V_P-3\Delta)$.

Likewise, at time $t=t_{pd}$ the effective program voltage $V_{PE}$ applied to selected memory cells coupled to selected bit lines in bit line group 1200$_{GB}$ is $V_{PE}=(V_P-\Delta-VGB_{SB})=(V_P-3\Delta)$. Similarly, at time $t=t_{pd}$ the effective program voltage $V_{PE}$ applied to selected memory cells coupled to selected bit lines in bit line group 1200$_{GC}$ is $V_{PE}=(V_P-2\Delta-VGB_{SC})=(V_P-3\Delta)$. Finally, at time $t=t_{pd}$ the effective program voltage $V_{PE}$ applied to selected memory cells coupled to selected bit lines in bit line group $1200_{GD}$ is $V_{PE}=(V_P-3\Delta-VGB_{SD})=(V_P-3\Delta)$.

As a result, without wanting to be bound by any particular theory, it is believed that the same effective program voltage $V_{PE}$ is applied to all selected memory cells of bit line groups $1200_{GA}$–$1200_{GD}$ along word line 1002.

In an embodiment, bit line driver circuits (e.g., the bit line driver circuits in sense amplifiers of sense blocks 212 of FIG. 2) are configured to generate the various selected bit line voltages $VB_{S0}$, $VB_{S1}$, $VB_{S2}$, $VB_{S3}$, ..., $VB_{SN-2}$, $VB_{SN-1}$ of the example described above and depicted in FIG. 11. In an embodiment, bit line driver circuits are configured to generate the various group selected bit line voltages $VGB_{SA}$, $VGB_{SB}$, $VGB_{SC}$ and $VGB_{SD}$ of the example described above and depicted in FIG. 12.

Figure 13:
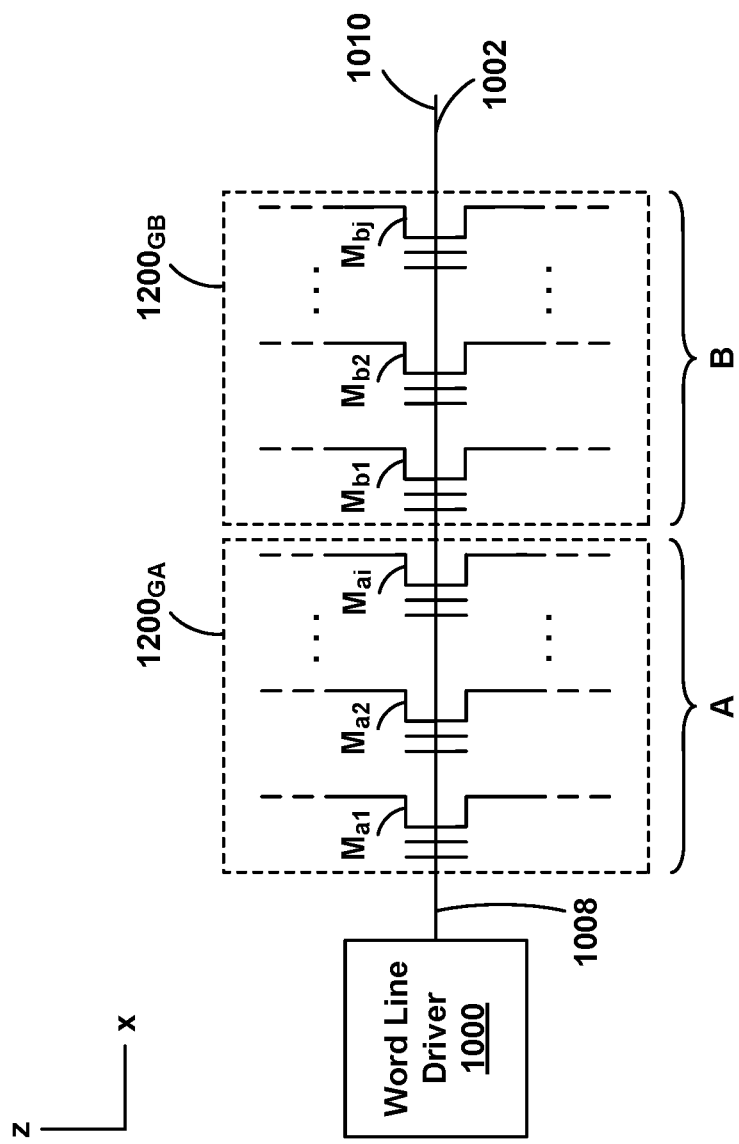
FIG. 13 depicts another simplified view of bit line groups of memory cells coupled to a word line.

FIG. 13 depicts a simplified view of M=2 bit line groups $1200_{GA}$ and $1200_{GB}$ of memory cells coupled to word line 1002. In the illustrated example, bit line group $1200_{GA}$ includes memory cells $M_{a1}$, $M_{a2}$, ..., $M_{ai}$, and bit line group $1200_{GB}$ includes memory cells $M_{b1}$, $M_{b2}$, ..., $M_{bj}$. Memory cells $M_{a1}$, $M_{a2}$, ..., $M_{ai}$, $M_{b1}$, $M_{b2}$, ..., $M_{bj}$, $M_{c1}$, $M_{c2}$, ..., span the length of word line 1002 from first end 1008 to second end 1010.

In an embodiment, memory cells $M_{a1}$, $M_{a2}$, ..., $M_{ai}$ of bit line group $1200_{GA}$ are coupled to a first portion A of word line 1002 closest to word line driver 1000, and memory cells $M_{b1}$, $M_{b2}$, ..., $M_{bj}$ of bit line group $1200_{GB}$ are coupled to a second portion B of word line 1002 farthest from word line driver 1000.

In an embodiment, each bit line group has a corresponding group selected bit line voltage $VGB_{SA}$. For example, group $1200_{GA}$ has a corresponding group selected bit line voltage $VGB_{SA}$, and group $1200_{GB}$ has a corresponding group selected bit line voltage $VGB_{SB}$.

In an embodiment, group selected bit line voltage $VGB_{SA}$ is a quick pass write (QPW) voltage and group selected bit line voltage $VGB_{SA}$ is ground (e.g., 0V). In a QPW arrangement, cells that are selected for programming that are approaching their target level are partially inhibited to slow the programming process for better accuracy by raising their bit line levels to QPW voltage above ground. For example, in some embodiments the QPW voltage is approximately 1V.

Thus, during programming selected bit lines coupled to memory cells $M_{a1}$, $M_{a2}$, ..., $M_{ai}$, of bit line group $1200_{GA}$ may be biased to the QPW voltage, and unselected bit lines coupled to memory cells $M_{a1}$, $M_{a2}$, ..., $M_{ai}$, of bit line group $1200_{GA}$ may be biased to an inhibit voltage (e.g., Vdd). In addition, during programming selected bit lines coupled to memory cells $M_{b1}$, $M_{b2}$, ..., $M_{bj}$ of bit line group $1200_{GB}$ may be biased to ground (e.g., 0V), and unselected bit lines coupled to memory cells $M_{b1}$, $M_{b2}$, ..., $M_{bj}$ of bit line group $1200_{GB}$ may be biased to an inhibit voltage (e.g., Vdd).

Thus, in memory systems that already include circuitry for generating a QPW voltage, the above described technology may be implemented for programming memory cells that are sorted into two separate groups—a first group nearer the word line driver, and a second group farther from the word line driver.

One embodiment includes an apparatus that includes a word line coupled to a word line driver circuit, bit lines, a plurality of non-volatile memory cells each coupled to the word line and a corresponding one of the bit lines, and a control circuit coupled to the word line and the bit lines. The control circuit is configured to program the memory cells by causing the word line driver to apply a program pulse to the word line, and biasing each bit line to a corresponding bit line voltage that has a value that varies based on a distance between the word line driver and the corresponding bit line.

One embodiment includes an apparatus that includes a word line coupled to a word line driver circuit, a plurality of bit line groups each comprising one or more bit lines, a plurality of non-volatile memory cells each coupled to the word line and a corresponding one of the bit lines, and a control circuit coupled to the word line and the bit lines. The control circuit is configured to program the memory cells by causing the word line driver to apply a program pulse to the word line, and biasing bit lines in each bit line group to a corresponding group bit line voltage that has a value that varies based on a distance between the word line driver and the corresponding bit line group.

One embodiment includes a method including programming a plurality of memory cells coupled to a word line that is coupled to a word line driver circuit, each memory cell coupled to a corresponding one of a plurality of bit lines. Programming by causing the word line driver to apply a program pulse to the word line, and biasing each bit line to a corresponding bit line voltage that has a value that varies based on an amount of resistive-capacitive loading on the word line at a vicinity of the corresponding bit line as seen by the word line driver.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

The invention claimed is:

1. An apparatus comprising:
a word line coupled to a word line driver circuit;
a plurality of bit lines;

a plurality of non-volatile memory cells each coupled to the word line and a corresponding one of the bit lines; and a control circuit coupled to the word line and the bit lines, the control circuit configured to program the memory cells by:

causing the word line driver to apply a program pulse to the word line; and biasing each bit line to a corresponding bit line voltage that decreases linearly with increasing distance between the word line driver and the corresponding bit line.

2. The apparatus of claim 1, wherein the control circuit is further configured to program the memory cells by biasing each bit line to a corresponding unique bit line voltage that has a value that varies based on a distance between the word line driver and the corresponding bit line.

3. The apparatus of claim 1, wherein the control circuit is further configured to program the memory cells by biasing each bit line to a corresponding unique bit line voltage that has a value that varies based on an amount of resistive-capacitive loading on the word line at a vicinity of the corresponding bit line as seen by the word line driver.

4. The apparatus of claim 1, wherein the control circuit is further configured to program the memory cells by biasing each bit line to a corresponding bit line voltage that has a value that varies based on a distance between the word line driver and the corresponding bit line.

5. The apparatus of claim 1, wherein the bit lines are not all biased to a same bit line voltage.

6. The apparatus of claim 1, wherein no two bit lines are biased to a same bit line voltage.

7. The apparatus of claim 1, wherein the control circuit is further configured to program the memory cells by causing the word line driver to apply a plurality of program pulses to the word line.

8. The apparatus of claim 1, wherein the control circuit is further configured to program the memory cells without performing any verify operations.

9. The apparatus of claim 1, wherein the control circuit is further configured to program the memory cells to natural threshold voltage distributions.

10. The apparatus of claim 1, wherein the control circuit is further configured to program the memory cells between an erased state and a plurality of programmed states.

11. An apparatus comprising:
a word line coupled to a word line driver circuit;
a plurality of bit line groups each comprising one or more bit lines;
a plurality of non-volatile memory cells each coupled to the word line and a corresponding one of the bit lines; and
a control circuit coupled to the word line and the bit lines, the control circuit configured to program the memory cells by:

causing the word line driver to apply a program pulse to the word line; and biasing bit lines in each bit line group to a corresponding group bit line voltage that has a value that decreases linearly with increasing distance between the word line driver and the corresponding bit line group.

12. The apparatus of claim 11, wherein the control circuit is further configured to program the memory cells by biasing bit lines in each bit line group to a corresponding unique group bit line voltage that has a value that varies based on a distance between the word line driver and the corresponding bit line group.

13. The apparatus of claim 11, wherein the control circuit is further configured to program the memory cells by biasing bit lines in each bit line group to a corresponding group bit line voltage that varies based on a distance between the word line driver and the corresponding bit line group.

14. The apparatus of claim 11, wherein all group bit line voltages are not the same voltage.

15. The apparatus of claim 11, wherein each bit line group comprises a same number of bit lines.

16. The apparatus of claim 11, wherein the control circuit is further configured to program the memory cells without performing any verify operations.

17. The apparatus of claim 11, wherein the control circuit is further configured to program the memory cells to natural threshold voltage distributions.

18. The apparatus of claim 11, wherein the control circuit is further configured to program the memory cells between an erased state and a plurality of programmed states.

19. A method comprising:
programming a plurality of memory cells coupled to a word line that is coupled to a word line driver circuit, each memory cell coupled to a corresponding one of a plurality of bit lines, by:
causing the word line driver to apply a program pulse to the word line; and
biasing each bit line to a corresponding bit line voltage that:
has a value that varies based on an amount of resistive-capacitive loading on the word line at a vicinity of the corresponding bit line as seen by the word line driver; and
decreases linearly with increasing distance between the word line driver and the corresponding bit line.

20. The method of claim 19, further comprising associating a first plurality of the bit lines with a first bit line group and associating a second plurality of the bit lines with a second bit line group, the bit lines in the first bit line group disposed closer to the word line driver than the bit lines of the second bit line group, wherein programming further comprises biasing bit lines in the first bit line group to a quick pass write voltage, and biasing bit lines in the second bit line group to ground.

* * * * *